US012757748B2

(12) United States Patent
Liu et al.

(10) Patent No.: US 12,757,748 B2
(45) Date of Patent: Oct. 6, 2026

(54) ALIGNED VIA AND TRACE FORMATION USING MULTI-TONE PHOITOMASKS AND MULTI-LAYER PHOTOSENSITIVE STACKS

(71) Applicant: Intel Corporation, Santa Clara, CA (US)

(72) Inventors: Changhua Liu, Chandler, AZ (US); Leonel R. Arana, Phoenix, AZ (US); Jeremy D. Ecton, Gilbert, AZ (US); Suddhasattwa Nad, Chandler, AZ (US); Brandon Christian Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 446 days.

(21) Appl. No.: 17/351,537

(22) Filed: Jun. 18, 2021

(65) Prior Publication Data

US 2022/0406618 A1 Dec. 22, 2022

(51) Int. Cl.
*H10W 70/05* (2026.01)
*H10W 20/00* (2026.01)
(Continued)

(52) U.S. Cl.
CPC ....... *H10W 70/095* (2026.01); *H10W 20/056* (2026.01); *H10W 20/081* (2026.01);
(Continued)

(58) Field of Classification Search
USPC .......................................................... 257/774
See application file for complete search history.

(56) References Cited

U.S. PATENT DOCUMENTS

2003/0027419 A1 2/2003 Chen
2010/0015805 A1* 1/2010 Mayer .................. H01L 21/288 438/692

(Continued)

FOREIGN PATENT DOCUMENTS

CN 112219164 A 1/2021
WO 2014030581 A1 2/2014

OTHER PUBLICATIONS

EPO; Extended European Search Report issued in EP Patent Application No. 22162572.6, dated Sep. 16, 2022; 8 pages.

(Continued)

*Primary Examiner* — Duy T Nguyen
*Assistant Examiner* — Jiyoung Oh
(74) *Attorney, Agent, or Firm* — Alliance IP, LLC

(57) ABSTRACT

Techniques for low- or zero-misaligned vias are disclosed. In one embodiment, a high-photosensitivity layer, a medium-photosensitivity layer, and a low-photosensitivity layer are applied to a substrate and exposed at the same time with use of a multi-tone mask. After being developed, one layer forms a mold for a first via, one layer forms a mold for a conductive trace and a second via, and one layer forms an overhang over the position for the second via. The molds formed by the photosensitive layers are filled with copper and then etched. The overhang prevents the top of the copper infill below the overhang region from being etched. As such, the region under the overhang forms a pillar or column after etching, which can be used as a via. Other embodiments are disclosed.

20 Claims, 16 Drawing Sheets

(51) Int. Cl.

| | |
|---|---|
| ***H10W 70/60*** | (2026.01) |
| ***H10W 70/63*** | (2026.01) |
| ***H10W 70/65*** | (2026.01) |

(52) U.S. Cl.

CPC ........ *H10W 70/611* (2026.01); *H10W 70/635* (2026.01); *H10W 70/65* (2026.01)

(56) References Cited

U.S. PATENT DOCUMENTS

| | | | | |
|---|---|---|---|---|
| 2013/0222936 | A1 | 8/2013 | Kawanishi | |
| 2014/0145329 | A1 * | 5/2014 | Haba | H01L 21/4853<br>257/737 |
| 2015/0205019 | A1 * | 7/2015 | Kawanishi | G03F 7/0007<br>430/7 |
| 2015/0277099 | A1 | 10/2015 | Hong et al. | |
| 2016/0183370 | A1 * | 6/2016 | Rawlings | H05K 3/0082<br>216/13 |
| 2017/0299960 | A1 * | 10/2017 | Parker | G03F 7/2004 |
| 2018/0209046 | A1 * | 7/2018 | Low | C23C 18/1653 |
| 2019/0206767 | A1 * | 7/2019 | Aleksov | H01L 21/481 |
| 2019/0304890 | A1 * | 10/2019 | Ecton | H10P 50/71 |
| 2020/0083154 | A1 * | 3/2020 | Gavagnin | H05K 3/064 |
| 2020/0126923 | A1 * | 4/2020 | Hu | H10P 72/74 |
| 2020/0211949 | A1 * | 7/2020 | Strong | H10W 70/65 |
| 2020/0219814 | A1 | 7/2020 | Strong et al. | |
| 2020/0258839 | A1 * | 8/2020 | Aleksov | H01L 21/0273 |
| 2022/0406654 | A1 | 12/2022 | Liu et al. | |

OTHER PUBLICATIONS

USPTO Final Office Action received in U.S. Appl. No. 17/351,536, dated Dec. 27, 2024, 5 pages.

USPTO Non-Final Office Action received in U.S. Appl. No. 17/351,536, dated May 22, 2025, 8 pages.

USPTO Examiner Interview Summary in U.S. Appl. No. 17/351,536 mailed on Aug. 25, 2025.

USPTO Non-Final Office Action received in U.S. Appl. No. 17/351,536, dated Nov. 6, 2025, 22 pages.

* cited by examiner

ALIGNED VIA AND TRACE FORMATION USING MULTI-TONE PHOITOMASKS AND MULTI-LAYER PHOTOSENSITIVE STACKS

BACKGROUND

Modern integrated circuits may have a large number of conductive traces connecting different components in the integrated circuit. In some cases, a redistribution layer of multiple layers of conductive traces may be used to connect components of an integrated circuit. The alignment of conductive traces and vias in different layers may impact how densely lines can be packed in the redistribution layer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Forming inter-layer vias with several distinct patterning steps can lead to misalignment between a via pad formed in one patterning and a via in a second patterning. In order to reduce or eliminate the misalignment, in one embodiment disclosed herein, three photosensitive layers with different photosensitivities are deposited on a substrate. The photoresists are exposed with a multi-tone mask, allowing the three photosensitive layers to be exposed to different patterns using the same mask. After development, the bottom layer forms a mold corresponding to a desired via. The middle layer forms a mold corresponding to a desired conductive path. The top layer forms an overhang that extends over the position of a desired via. As a result, the top photoresist forms an overhang over the mold defined by the lower photoresist where a via will be. Copper is plated to fill the molds and then etched back. The etching process etches the copper down to a desired thickness for the conductive path and partially etches under the overhang formed by the top photoresist. The etch process will not fully etch under the overhang, forming a via that is aligned to the conductive path beneath it.

Figure 1:
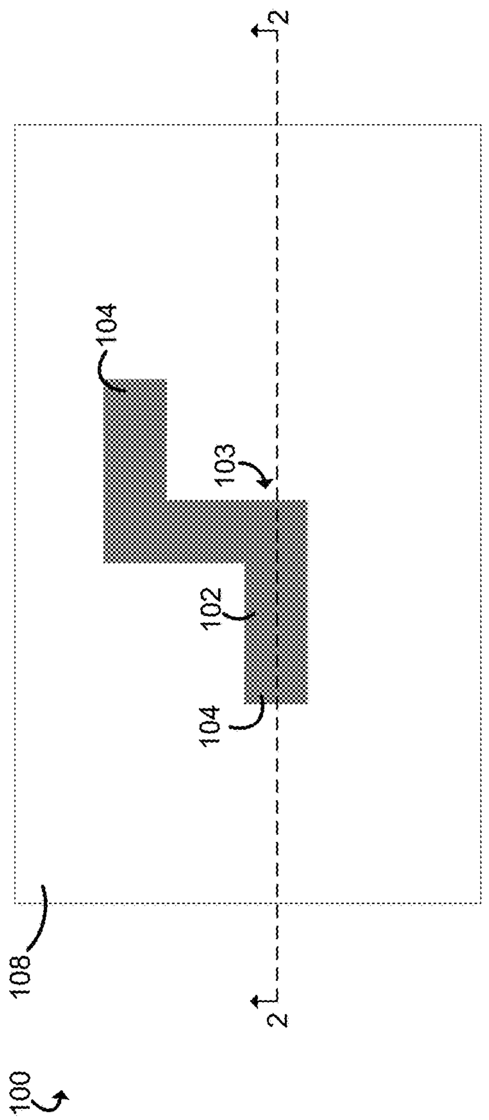
FIG. 1 is a top-down view of a simplified diagram of a system with a conductive trace and via on a substrate.
Figure 2:
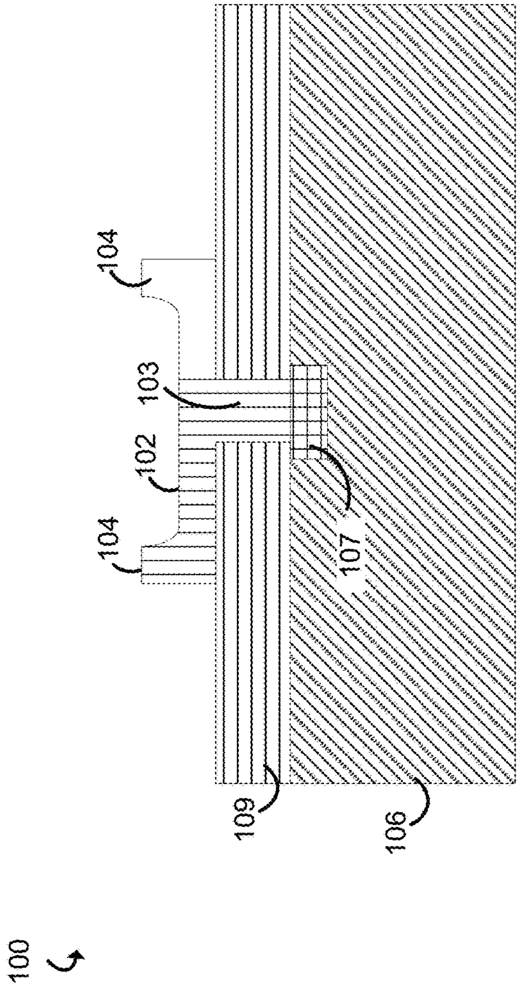
FIG. 2 is a cross-section view of the system of FIG. 1.

Referring now to FIGS. 1 & 2, in one embodiment, a system 100 includes a via 103 connected to a metal pad 107 in a substrate 106. The via 103 passes through a dielectric layer 109 and is connected to a conductive trace 102. The conductive trace 102 is connected to two vias 104 that extend towards another layer of the system 100 (not shown). The system 100 can be created as described in more detail below in regard to the method 300 described in FIG. 3 and as shown in FIGS. 4-19. It should be appreciated that, in the illustrative embodiment, the vias 103, 104 are positioned relative to the conductive trace 102 without misalignment. As such, a pad that is larger than the vias 104, 103 or conductive trace 102 is not required in order to compensate for any misalignment between the conductive trace 102 and the vias 103, 104.

The conductive trace 102 and vias 103, 104 may have any suitable dimensions. For example, in the illustrative embodiment, the conductive trace 102 may have a length of 10-200 micrometers, a width of 0.5-4 micrometers, and/or a thickness of 0.5-4 micrometers. The illustrative vias 103, 104 may have a length and/or width of 0.5-4 micrometers and a thickness of 2-10 micrometers. In other embodiments, the conductive trace 102 may have, e.g., a length of 0.1-10,000 micrometers, a width of 0.05-40 micrometers, and/or a thickness of 0.05-40 micrometers. In other embodiments, the vias 103, 104 may have, e.g., a length and/or width of 0.05-40 micrometers and/or a thickness of 0.1-100 micrometers. The conductive trace 102 and vias 103, 104 may be any suitable material. In the illustrative embodiment, the trace 102 and vias 103, 104 are copper. In other embodiments, the trace 102 and/or vias 103, 104 (or any other traces or vias disclosed herein) may be another material, such as aluminum, gold, tungsten, tantalum, hafnium, zirconium, silver, tin, lead, metal alloys, metal carbides, doped semiconductor, etc.

In some embodiments, there may be multiple conductive traces 102 and/or vias 103, 104 near each other. For example, in one embodiment, an array of conductive traces 102 may be connected to an array of vias 103 and/or vias 104. A pitch of the conductive traces 102 may be any suitable value, such as two to five times the width of the conductive traces 102. As there is little or no misalignment between the vias 103, 104 and the conductive traces 102, the pitch of the vias 103, 104 may be the same as that of the conductive traces 102. For example, the pitch of the vias 103, 104 may be two to five times the width of the conductive traces 102.

The substrate 106 may be any suitable material. In the illustrative embodiment, the substrate 106 is silica. In other embodiments, the substrate 106 may be any suitable material, such as silicon, a III-V substrate, a dielectric, a semiconductor, a fiberglass-based material such as FR-4, etc.

In the illustrative embodiment, the dielectric layer 109 is a photoimageable dielectric layer 109 that is formed as part of the process for creating the vias 103, 104 and conductive trace 102, described in more detail below.

In the illustrative embodiment, the metal pad 107 may be another material, such as aluminum, gold, tungsten, tantalum, hafnium, zirconium, silver, tin, lead, metal alloys, metal carbides, doped semiconductor, etc. In the illustrative embodiment, the metal pad 107 is slightly larger than the via 103 in order to accommodate any misalignment between the metal pad 107 and the via 103. The metal pad 107 may be 0.1-10 micrometers wider than the via 103. For example, the via 103 may have a diameter of 2 micrometers, and the metal pad 107 may have a diameter of 3 micrometers. The metal pad 107 may be connected to other components in the substrate, such as one or more conductive traces, vias, etc.

The system 100 may include other components not shown in FIG. 1, such as other conductive traces, other vias, other structures such as transistors or capacitors, etc. The system 100 may include one or more layers above or below the conductive trace 102 and via 104. The system 100 may include components packaged into a package, such as a circuit board, an integrated heat spreader, one or more pins or contact pads, etc. The system 100 may be embodied as, form a part of, or include one or more single- or double-sided dies or one or more single- or double-sided wafers. The conductive trace 102 and via 104 may be surrounded by a dielectric layer (not shown) above the substrate 106. In some embodiments, the conductive trace 102 and via 104 may be part of a redistribution layer of an integrated circuit such as a processor. In other embodiments, the conductive trace 102 and via 104 may be part of any suitable device, such as a processor, a printed circuit board, an application-specific integrated circuit (ASIC), or any other suitable device.

Figure 3:
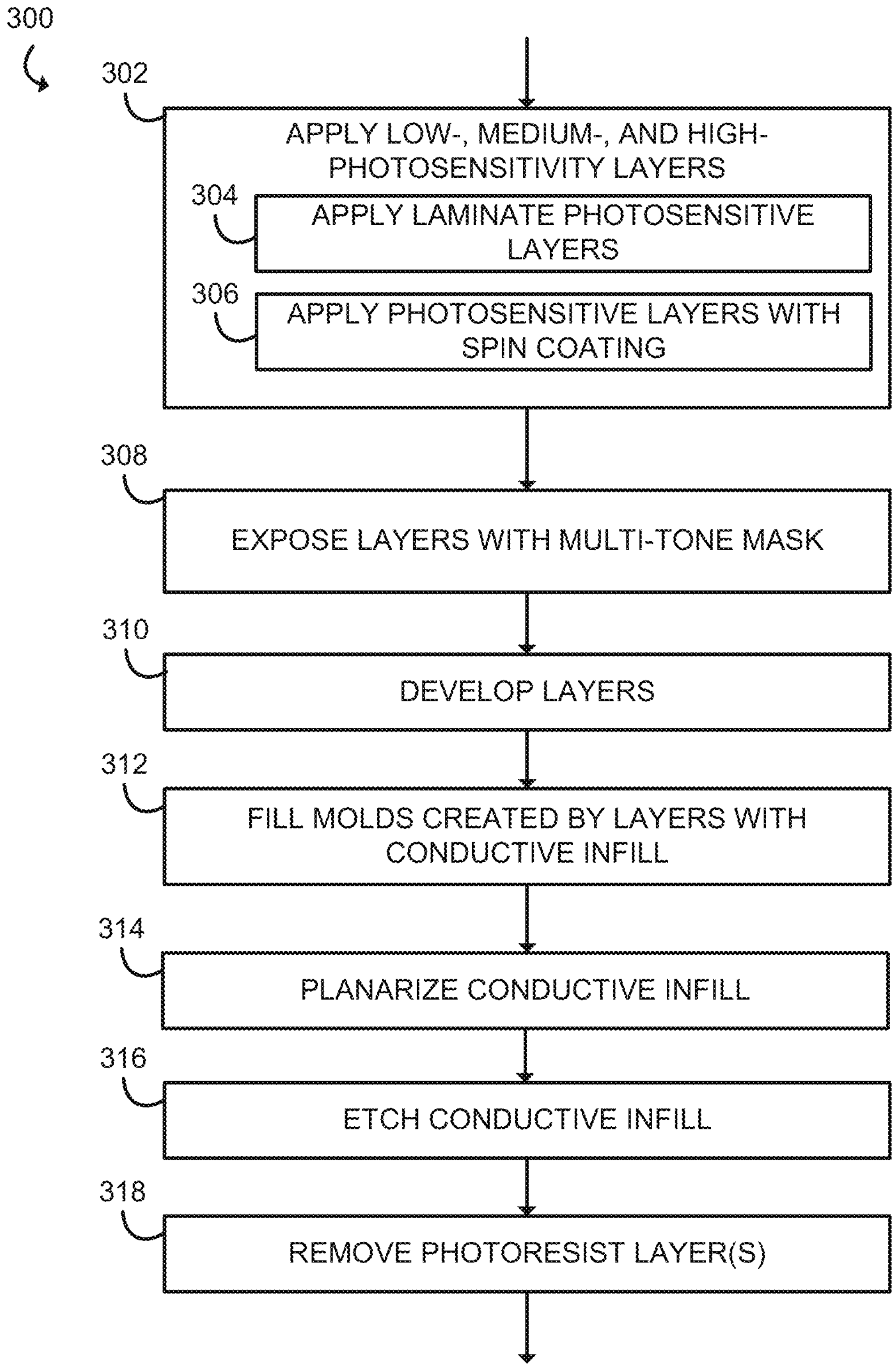
FIG. 3 is a simplified flow diagram of at least one embodiment of a method for creating the conductive trace and via of FIG. 1.
Figure 4:
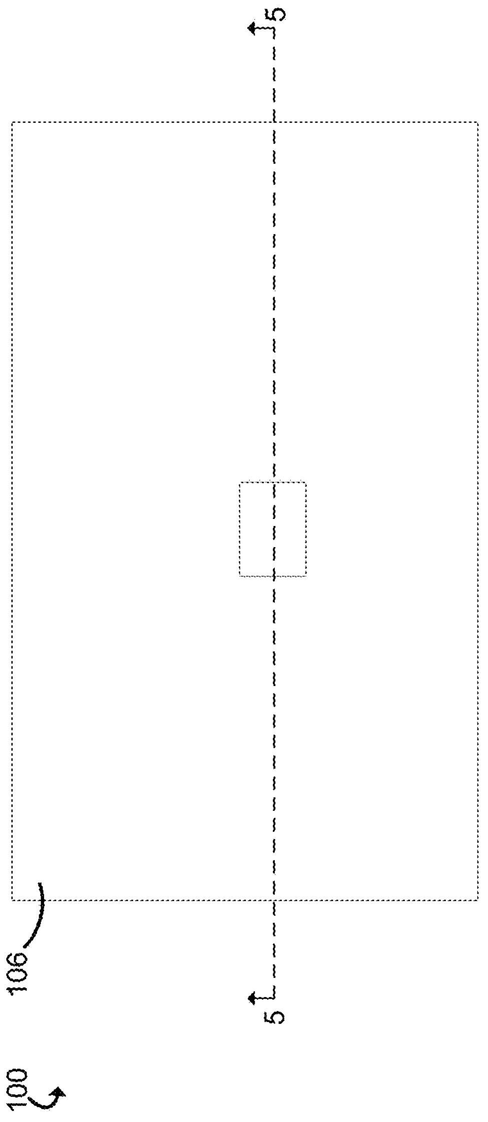
FIG. 4 is a top-down view of a system at one or more steps of the method of FIG. 3.
Figure 5:
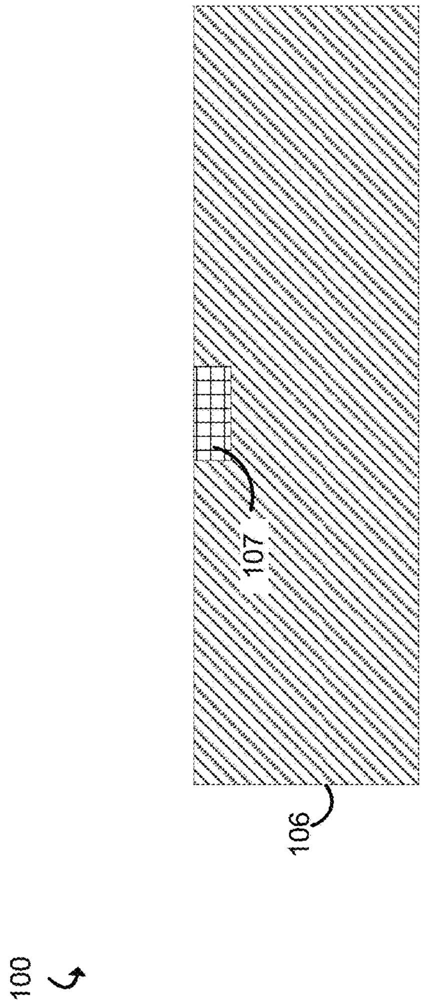
FIG. 5 is a cross-section view of the system of FIG. 4.
Figure 6:
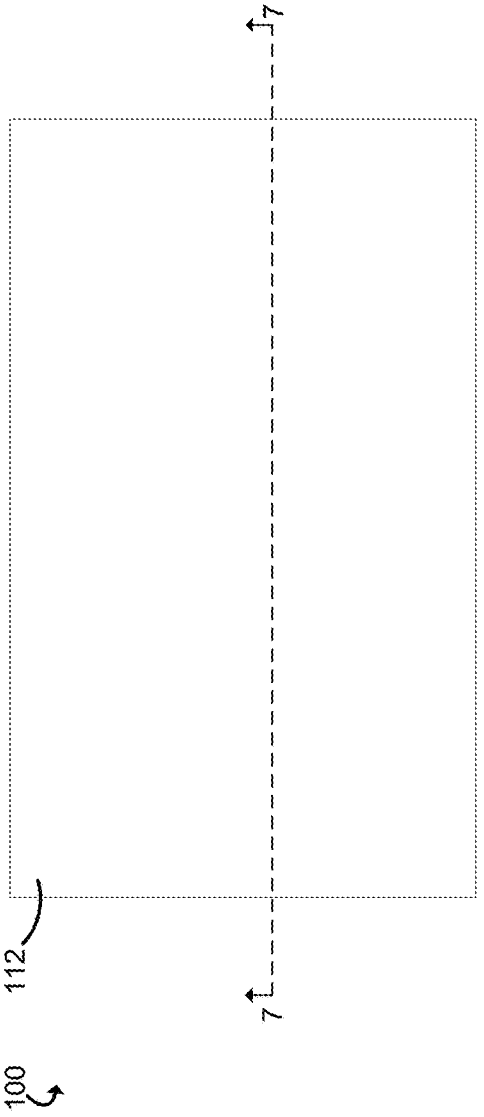
FIG. 6 is a top-down view of a system at one or more steps of the method of FIG. 3.
Figure 7:
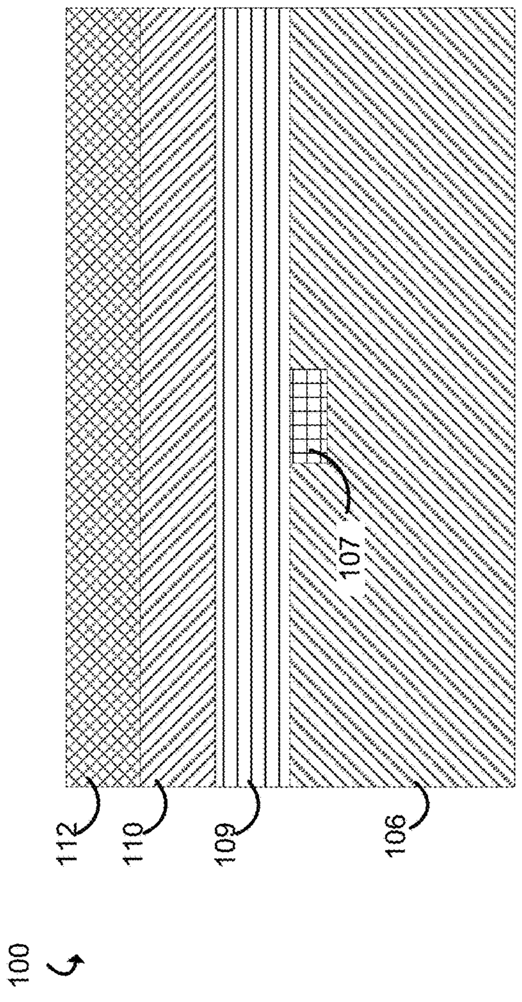
FIG. 7 is a cross-section view of the system of FIG. 6.

Referring now to FIG. 3, in one embodiment, a method 300 for creating a low- or zero-misaligned via, such as the vias 103, 104 shown in FIGS. 1 and 2, is shown. FIGS. 4-19 correspond to different stages of the method 300. FIGS. 5, 7, 9, 11, 13, 15, 17 and 19 correspond to cross-sections of FIGS. 4, 6, 8, 10, 12, 14, 16, and 18, respectively. The method 300 begins in block 302, in which a first photosensitive layer 109, a second photosensitive layer 110, and a third photosensitive layer 112 are applied to the substrate 106. FIGS. 4 and 5 show the system 100 prior to application of the photosensitive layers 109, 110, 112, and FIGS. 6 and 7 show the system 100 after application of the photosensitive layers 109, 110, 112.

In the illustrative embodiment, the photosensitive layer 109 is a photoimageable dielectric (PID) layer 109. The PID layer 109 may be any suitable PID material. The illustrative PID layer 109 is a high-photosensitivity material.

In the illustrative embodiment, the photosensitive layer 110 is a low-photosensitivity photoresist layer 110. In other embodiments, the photosensitive layer 110 may be a low-photosensitivity PID material. The illustrative photosensitive layer 112 is a medium-photosensitivity photoresist layer 112. The photosensitive layers 110, 112 may be any suitable photoresist material. The difference in photosensitivity between the layers 109, 110, 112 may be due to use of a different material or may be due to, e.g., a modulation of the photo-initiator or sensitizer concentrations in the photoresist material or PID material.

The low-photosensitive material may also be referred to as a high-dose material or a low-speed material. The medium-photosensitive material may also be referred to as a medium-dose material or a medium-speed material The high-photosensitivity resist may also be referred to as a low-dose resist or a high-speed resist. In the illustrative embodiment, each of the photosensitive layers 109, 110, 112 is 0.5-4 micrometers thick. In other embodiments, the photosensitive layer 110 and/or 112 may be any suitable thickness, such as 0.1-100 micrometers. It should be appreciated that, in the illustrative embodiment, the photosensitive layer 109 is the same height as the via 103, and the photosensitive layer 110 is the same height as the height of the conductive trace 102 plus the height of the via 104. In some embodiments, the photosensitive layer 112 may be smaller than the other photosensitive layers 109, 110. For example, the photosensitive layer 112 may be 0.5 micrometers thick, while the photosensitive layers 109, 110 are 10 micrometers thick.

The photosensitive layers 109, 110, 112 may be applied in any suitable manner. For example, in the illustrative embodiment, the photosensitive layers 109, 110, 112 are applied as laminate photosensitive layers 109, 110, 112 in block 304. In other embodiments, in block 306, the photosensitive layers 109, 110, 112 are applied using spin coating. In the illustrative embodiment, each of the photosensitive layers 109, 110, 112 is a negative photoresist. As such, the portion of each photosensitive layer 109, 110, 112 that is exposed to a sufficient amount of light during exposure will remain in place after the unexposed portion has been removed. In other embodiments, the photosensitive layer 109, 110, and/or 112 may be a positive photoresist. Of course, certain aspects of the method 300 may be different with positive photoresists, such as the relative photosensitivity of the photosensitive layers 109, 110, 112 and the areas of the photosensitive layers 109, 110, 112 exposed to light during the exposure process.

Figure 8:
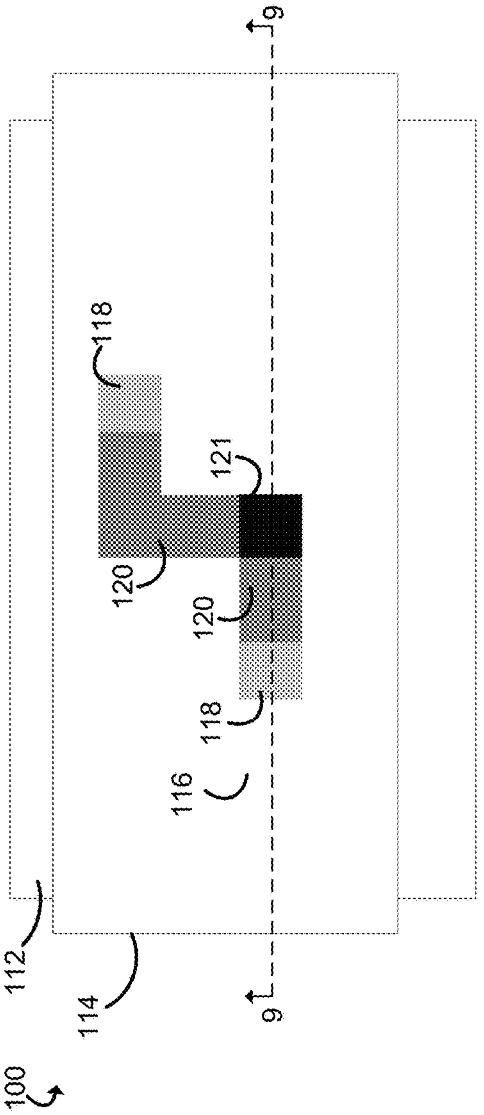
FIG. 8 is a top-down view of a system at one or more steps of the method of FIG. 3.
Figure 9:
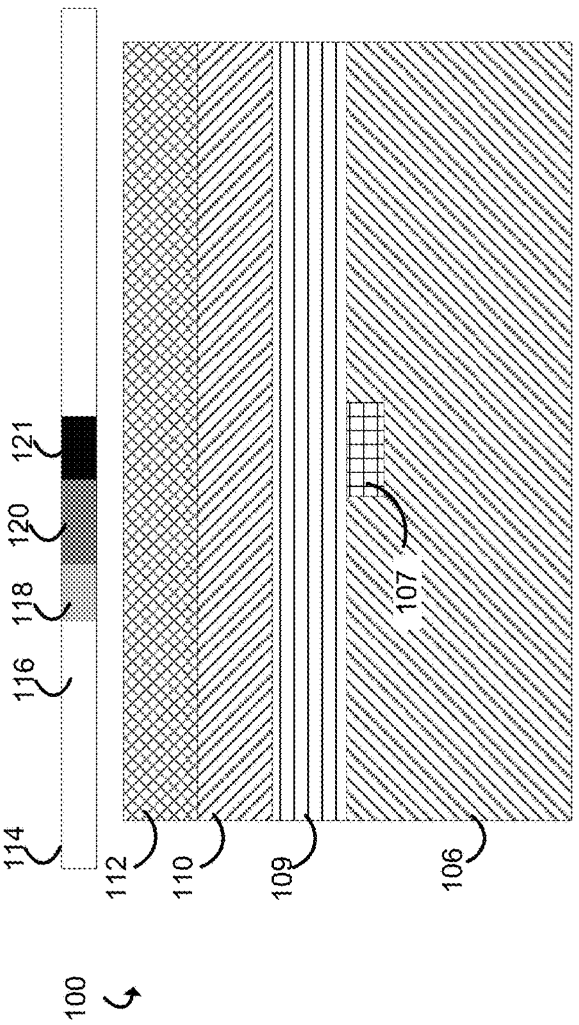
FIG. 9 is a cross-section view of the system of FIG. 8.

In block 308, the photosensitive layers 110, 112 are exposed to ultraviolet light or other electromagnetic radiation with use of a multi-tone photomask 114 (see FIGS. 8 and 9). The electromagnetic radiation may be any suitable wavelength, such as 13 nanometers to 400 nanometers. In the illustrative embodiment, the mask 114 has one or more transparent light (or high-transmission) regions 116 that expose all photosensitive layers 109, 110, 112, one or more light gray regions 118 that expose the high-photosensitivity layer 109 and the medium-photosensitivity layer 112 but not the low-photosensitivity layer 110, one or more dark gray regions 120 that expose the high-photosensitivity layer 109 but not the medium-photosensitivity layer 112 or the low-photosensitivity layer 110, and one or more dark regions 121 that do not expose any of layers 109, 110, 112. As used herein, to "expose" a layer means to apply enough electromagnetic radiation at a suitable wavelength to part of the layer to cause a photochemical or other change that will result in part of the layer being removed after development while the rest of the layer remains after development. In the illustrative embodiment, the dark region 121 corresponds to where the via 103 will be, the dark gray regions 120 correspond to where the conductive trace 102 will be, the light gray regions 118 correspond to where the vias 104 will be, and the transparent region 116 corresponds to where neither a conductive trace 102 nor a via 103, 104 will be. The light, light gray, dark gray, and dark regions may transmit any suitable amount of incoming light. For example, the dark regions 121 may transmit 0-25% of incoming exposure light, the dark gray regions 120 may transmit 25-50% of incoming exposure light, the light gray regions 118 may transmit 50-75% of incoming exposure light, and the light region 116 may transmit 75-100% of incoming exposure light. The dark gray regions 120 will transmit more electromagnetic radiation at the wavelength in use than the dark regions 121, the light gray regions 118 will transmit more electromagnetic radiation at the wavelength in use than the dark gray regions 120, and the light regions 116 will transmit more electromagnetic radiation at the wavelength in use than the light gray regions 118.

Figure 10:
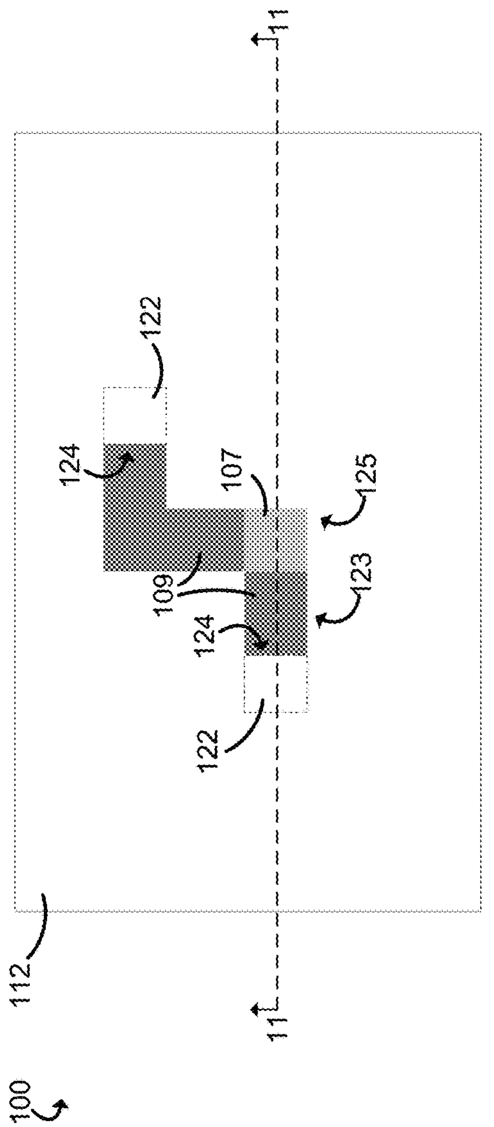
FIG. 10 is a top-down view of a system at one or more steps of the method of FIG. 3.
Figure 11:
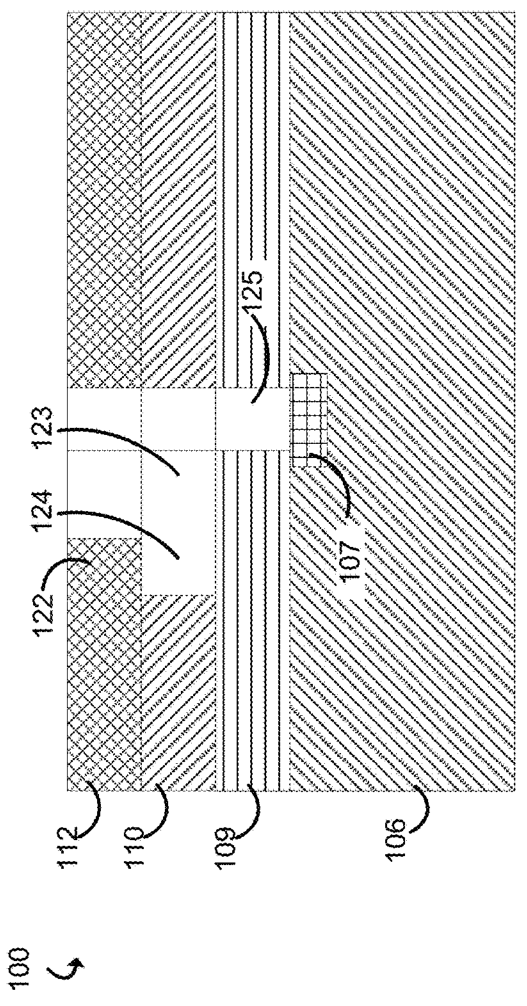
FIG. 11 is a cross-section view of the system of FIG. 10.

In block 310, the photosensitive layers 109, 110, 112 are developed, removing the portions of the layers 109, 110, 112 not exposed to sufficient amounts of light (see FIGS. 10 & 11). In the illustrative embodiment, each photosensitive layer 109, 110, 112 can be developed with the same process. In some embodiments, the medium-sensitivity layer 112 may be developed with one process, and then the low-sensitivity layer 110 may be developed with a second process, and then the high-sensitivity photosensitive layer 109 may be developed with a third process. After removing the unexposed portions of the photosensitive layers 109, 110, 112, the photosensitive layers 109, 110, 112 form one or more molds around where the conductive trace 102 and vias 103, 104 will be. In the illustrative embodiment, the photosensitive layer 110 defines a mold with a conductive trace region 123 that corresponds to where the conductive trace 102 will be and one or more via regions 124 above the conductive trace region 123 that correspond to where the vias 104 will be. The photosensitive layer 109 defines a mold with a via region 125 below the trace region 123 that corresponds to where the via 103 will be. It should be appreciated that, in the illustrative embodiment, the mold with the trace region 123 is connected to the mold with the conductive trace region 123, so the corresponding via 103 will be connected to the conductive trace 102 when the molds are filled. The top photosensitive layer 112 has an overhang region 122 that extends over the via region 124 where the photosensitive layer 110 was removed.

Figure 12:
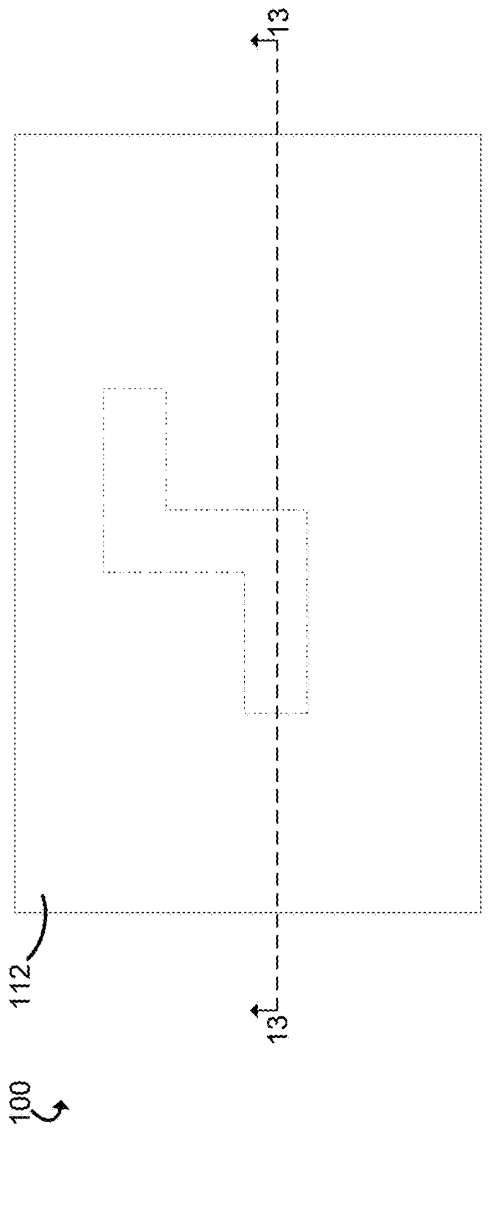
FIG. 12 is a top-down view of a system at one or more steps of the method of FIG. 3.
Figure 13:
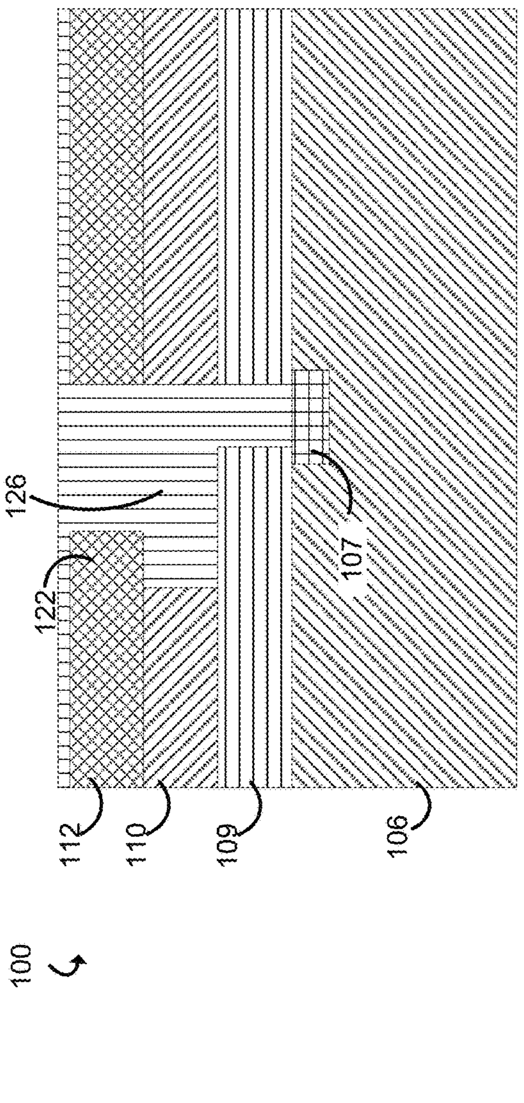
FIG. 13 is a cross-section view of the system of FIG. 12.

In block 312, in the illustrative embodiment, the one or more molds created by the photosensitive layers 109, 110, 112 are filled by a conductive infill 126, as shown in FIGS. 12 and 13. In the illustrative embodiment, the conductive infill 126 is copper. In other embodiments, the conductive infill 126 can be another material, such as those that could be used to form the conductive trace 102 and via 104 discussed above. In the illustrative embodiment, electroless copper plating is first performed to establish an initial layer of copper, then the one or more molds is first filled using electroplating of copper. In other embodiments, other techniques may be used to deposit the material in the one or more molds, such as any suitable combination of electroless plating, sputtering, chemical vapor deposition, atomic layer deposition, etc. In the illustrative embodiment, the conductive infill 126 is applied until it is at least the height of the photosensitive layer 112, completely filling the via region 124 up to the overhang region 122.

Figure 14:
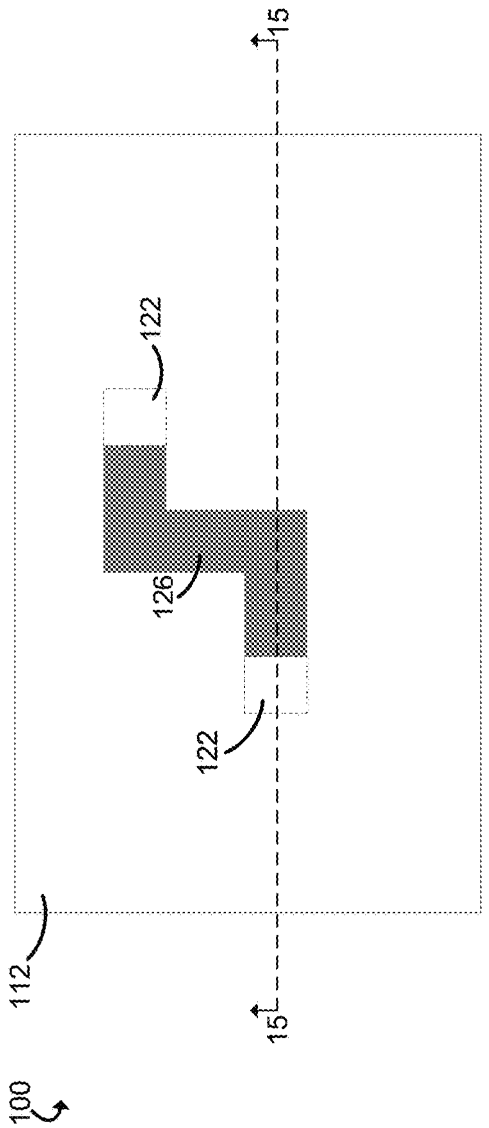
FIG. 14 is a top-down view of a system at one or more steps of the method of FIG. 3.
Figure 15:
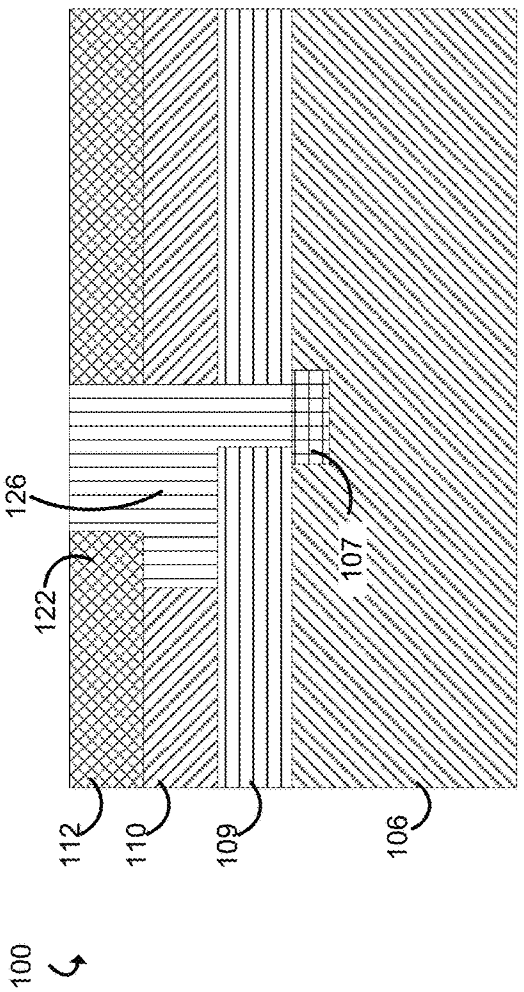
FIG. 15 is a cross-section view of the system of FIG. 14.

In block 314, the conductive infill is planarized (see FIGS. 14 and 15). After planarization, the portion of the conductive infill 126 is removed until the conductive infill 126 is level with the photosensitive layer 112.

Figure 16:
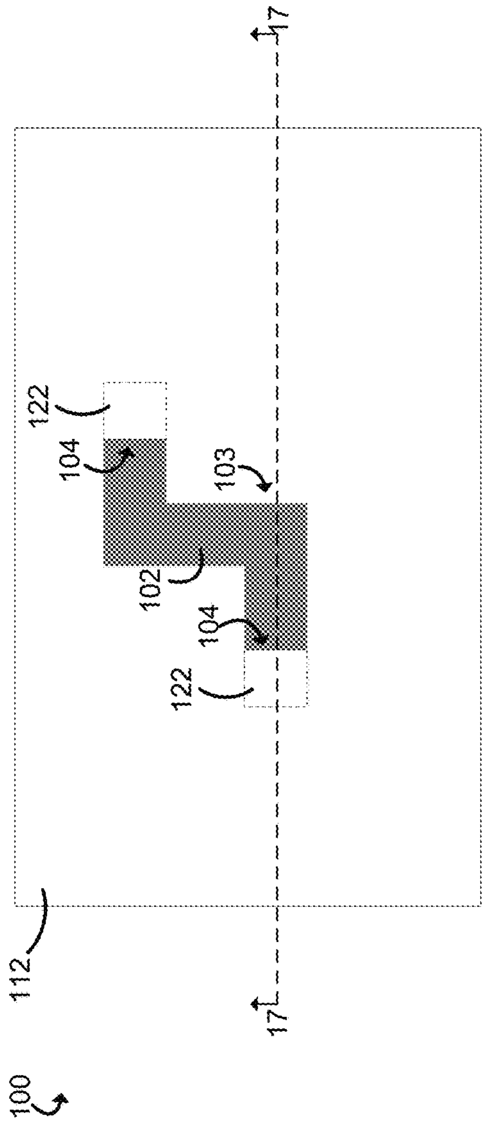
FIG. 16 is a top-down view of a system at one or more steps of the method of FIG. 3.
Figure 17:
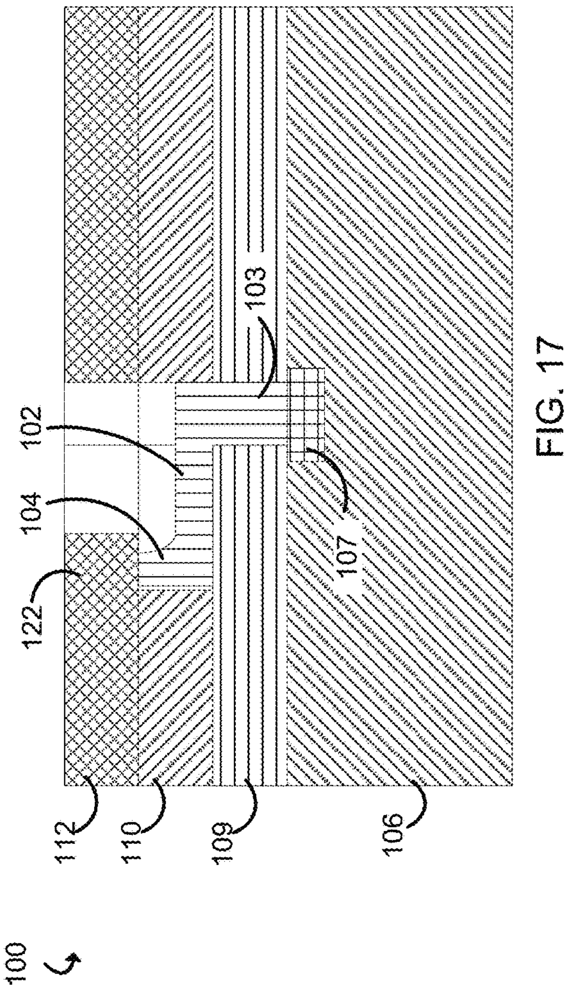
FIG. 17 is a cross-section view of the system of FIG. 16.

In block 316, part of the conductive infill 126 is etched away using an etchant, as shown in FIGS. 16 and 17. In the illustrative embodiment, an isotropic wet etching process is used. The conductive infill 126 is etched down from the top surface of the conductive infill 126 until the conductive infill 126 corresponding to the conductive trace 102 is at a desired height. The "top surface" of the conductive infill 126 refers to the surface that is opposite a bottom surface of the conductive infill 126 that is in contact with the substrate 106 on which the conductive infill 126 is grown and does not imply any particular orientation of the system 100.

Because the overhang region 122 stops the etchant from reaching the top surface of the infill 126 that is directly under the overhang region 122, the conductive infill 126 under the overhang region 122 is laterally etched as the conductive infill 126 in the conductive trace region 123 is etched downward, creating a pillar or column with a scalloped or concave profile, with a narrower region that is distal from the substrate 106 and a broader region proximal the substrate 106, as shown in FIG. 17. Because the etching is stopped before the part of the infill 126 under the overhang region 122 is fully etched, the etched infill 126 forms the conductive trace 102, the via 103, and the vias 104. Because the infill 126 forms both the conductive trace 102 and the vias 103, 104 as outlined by the photosensitive layers 109, 110, 112, the vias 103, 104 are automatically aligned to the conductive trace 102. In contrast to the scalloped profile of the via 104 shown in FIG. 17, the profile of a cross-section of the conductive traces 102, the via 103, and/or the profile a cross-section of the via 104 orthogonal to the conductive traces 102 may be linearly tapered from a narrower width distal to the substrate 106 to a broader width proximal to the substrate 106, due to the photolithography process.

In the illustrative embodiment, chemical etching is used to etch the infill 126. In other embodiments, other etching techniques may be used, such as reactive ion etching. Use of techniques such as reactive ion etching may change the final shape of the via 104 as little to no material may be removed under the overhang region 122.

The photosensitive layers 110, 112, can then be removed in block 318, leaving the conductive traces 102 and the vias 103, 104 on the substrate 106 and photosensitive layer 109, as shown in FIGS. 1 and 2. It should be appreciated that the PID layer 109 is not removed but rather is kept in place, as it is supporting the conductive trace 102.

Figure 18:
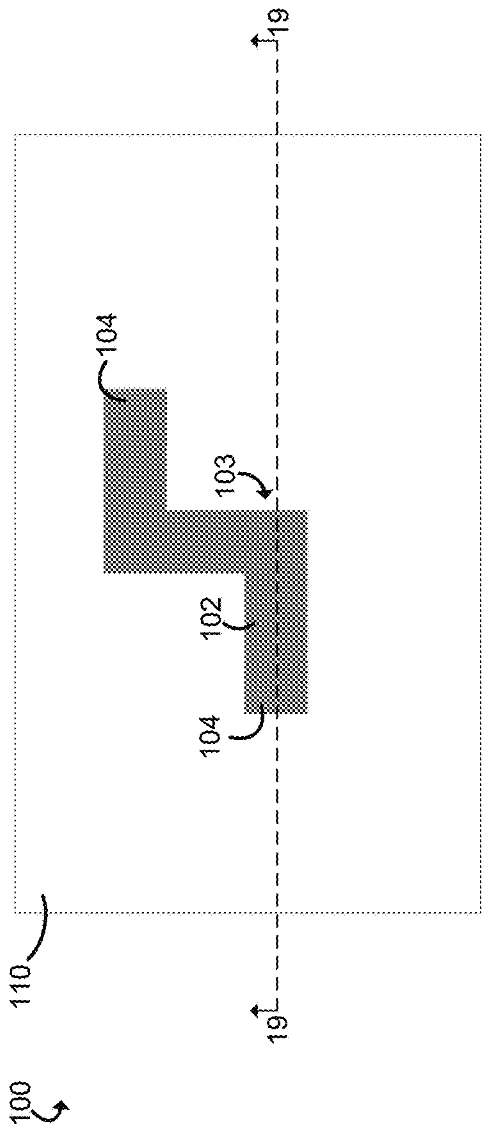
FIG. 18 is a top-down view of a system at one or more steps of the method of FIG. 3.
Figure 19:
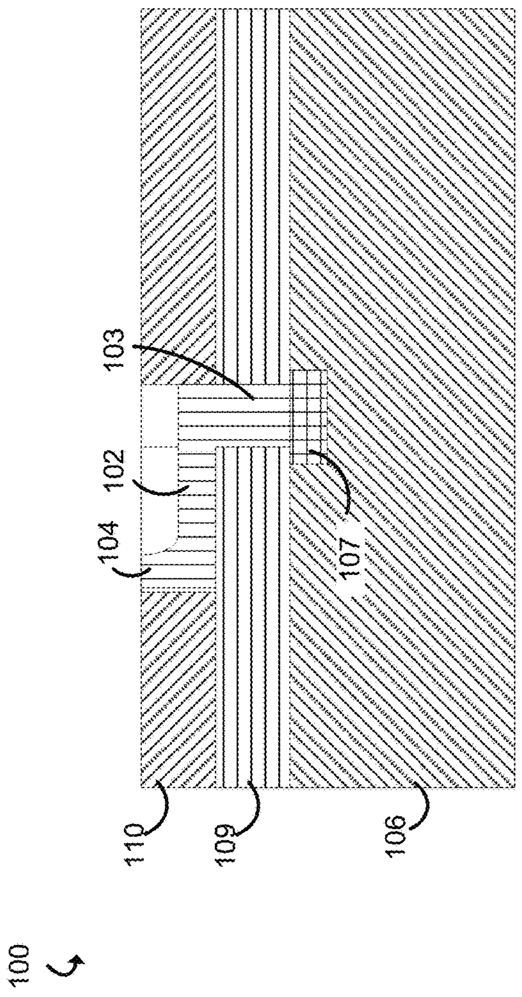
FIG. 19 is a cross-section view of the system of FIG. 18.

In some embodiments in which the photosensitive layer 110 is a PID layer 110, the photosensitive layer 112 is removed but the PID layer 110 is kept in place, as shown in FIGS. 18 and 19. In some embodiments, the PID layer 109 and/or the PID layer 110 may be cured before the photosensitive layers 110 and/or 112 are removed.

After removal of the photosensitive layers 110 and/or 112, other processing may be performed on the system 100, such as applying an oxide or other insulating layer, performing via reveal, creating another layer of conductive traces 102 and/or vias 104, cutting a wafer into dies, packaging dies in a package, etc.

Figure 20:
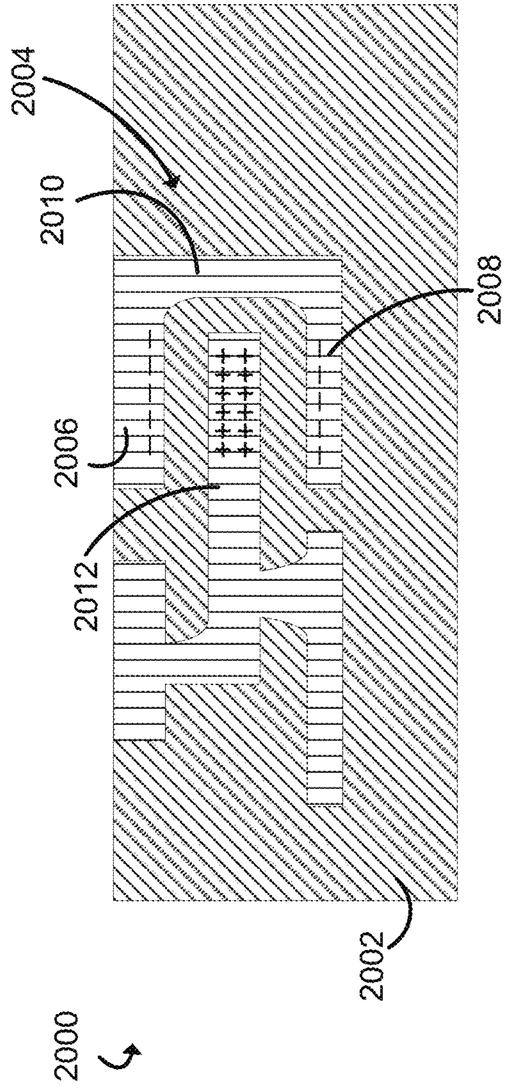
FIG. 20 is a cross-section view of a simplified diagram of a capacitor.

It should be appreciated that the techniques disclosed herein may be used to create any suitable structure. For example, in one embodiment, a system 2000 is shown in FIG. 20. The system 2000 includes a substrate 2002. A capacitor 2004 is formed from an upper conductive trace 2006 of a first plate, a lower conductive trace 2008 of the first plate, a via 2010 connecting the upper conductive trace 2006 and the lower conductive trace 2008, and a conductive trace 2012 of a second plate. Each of the upper conductive trace 2006, the lower conductive trace 2008, the via 2010, and/or the conductive trace 2012 may be relatively wide, giving a relatively large capacitance for the capacitor. Each of the upper conductive trace 2006, the lower conductive trace 2008, the via 2010, and/or the conductive trace 2012 may be formed using the techniques disclosed herein. Each of the upper conductive trace 2006, the lower conductive trace 2008, the via 2010, and/or the conductive trace 2012 may be connected to other traces, components, voltage sources, etc.

Figure 21:
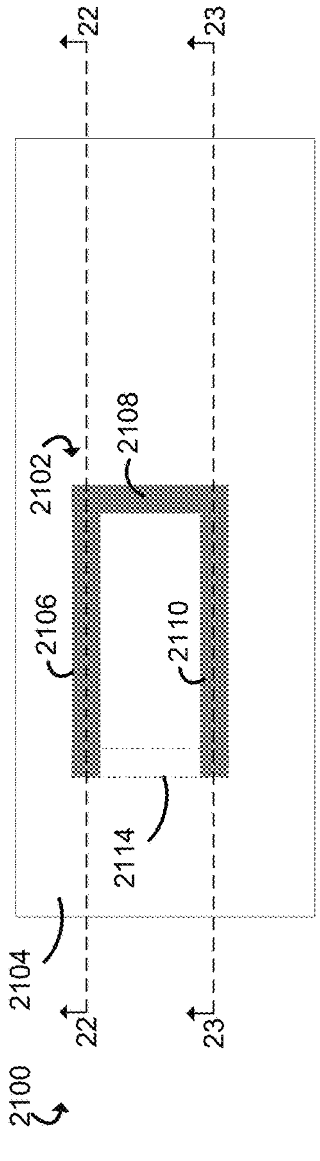
FIG. 21 is a top-down view of a simplified diagram of an inductor.
Figure 22:
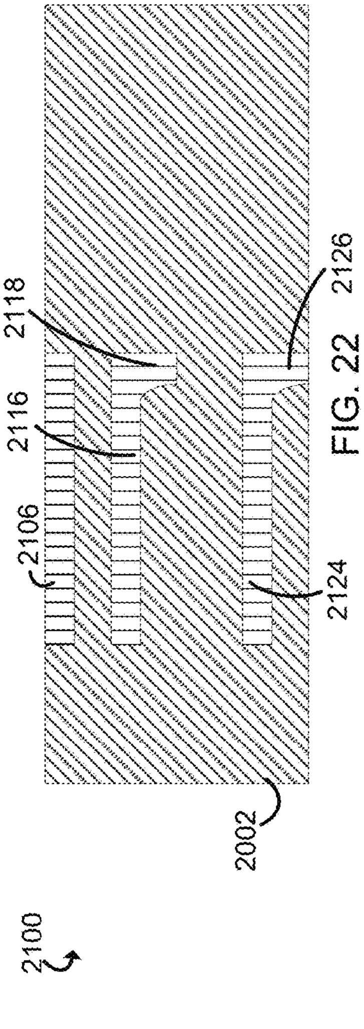
FIG. 22 is a cross-section view of a simplified diagram of the inductor of FIG. 21.
Figure 23:
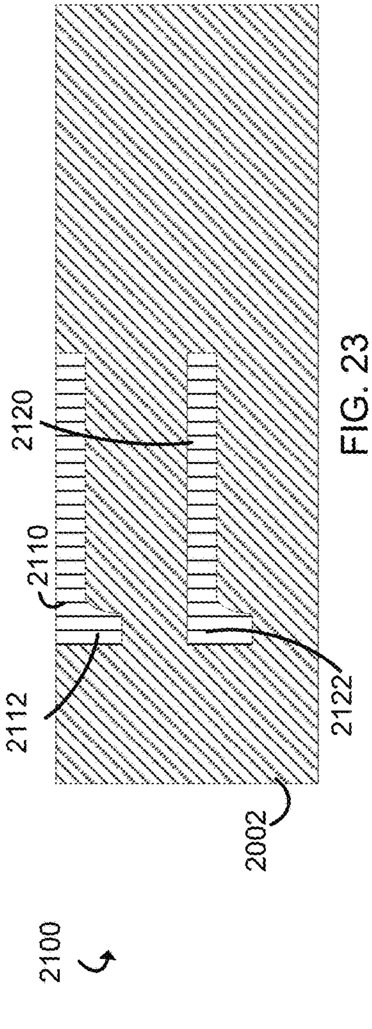
FIG. 23 is a cross-section view of a simplified diagram of the inductor of FIG. 21.

As another example, in one embodiment, a system 2100 including an inductor 2102 on a substrate 2104 is shown in FIGS. 21-23. The inductor 2102 includes several traces and vias arranged roughly in a spiral shape to concentrate magnetic flux inside the spiral. A current path for the inductor 2102 is from conductive traces 2106, 2108, and 2110 at a first layer of the system 2100. The current path then passes through a via 2112 to a second layer, and then it passes through a conductive trace 2114 and 2116 to another via 2118 to pass to a third layer. The current path then passes through another conductive trace (not visible in FIGS. 21-50) from via 2118 to conductive trace 2120. The current path passes through via 2122 to a fourth layer. The current path passes through a conductive trace (not visible in FIGS. 21-23) from via 2122 to conductive trace 2124. The current path passes through another via 2126 to a fifth layer.

The system 2100 may include other components not shown, such as other traces connected to the inductor 2102. The inductor 2102 may have any suitable number of layers, any suitable number of turns, or any suitable inductance.

Figure 24:
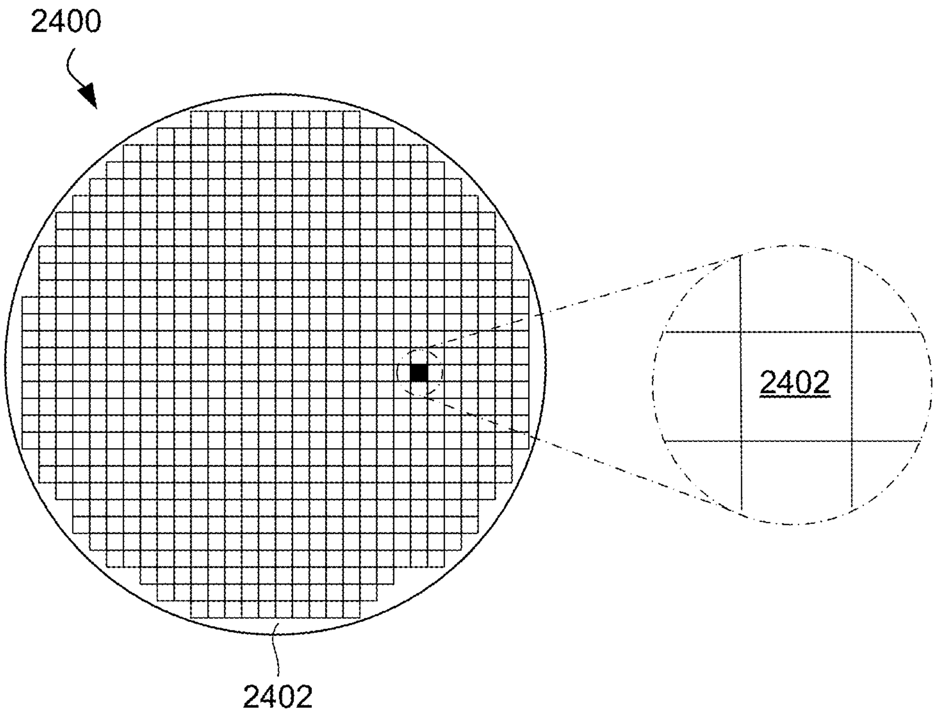
FIG. 24 is a top view of a wafer and dies that may be included in a microelectronic assembly, in accordance with any of the embodiments disclosed herein.

FIG. 24 is a top view of a wafer 2400 and dies 2402 that may be included in any of the systems 100 disclosed herein. The wafer 2400 may be composed of semiconductor material and may include one or more dies 2402 having integrated circuit structures formed on a surface of the wafer 2400. The individual dies 2402 may be a repeating unit of an integrated circuit product that includes any suitable integrated circuit. After the fabrication of the semiconductor product is complete, the wafer 2400 may undergo a singulation process in which the dies 2402 are separated from one another to provide discrete "chips" of the integrated circuit product. The die 2402 may be embodied as part or include some or all of the substrate 106. The die 2402 may include one or more transistors (e.g., some of the transistors 2540 of FIG. 25, discussed below), supporting circuitry to route electrical signals to the transistors, passive components (e.g., signal traces, resistors, capacitors, or inductors), and/or any other integrated circuit components. In some embodiments, the wafer 2400 or the die 2402 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2402. For example, a memory array formed by multiple memory devices may be formed on a same die 2402 as a processor unit (e.g., the processor unit 2702 of FIG. 27) or other logic that is configured to store information in the memory devices or execute instructions stored in the memory array. Various ones of the system 100 disclosed herein may be manufactured using a die-to-wafer assembly technique in which some dies of the system 100 are attached to a wafer 2400 that include others of dies of the system 100, and the wafer 2400 is subsequently singulated.

Figure 25:
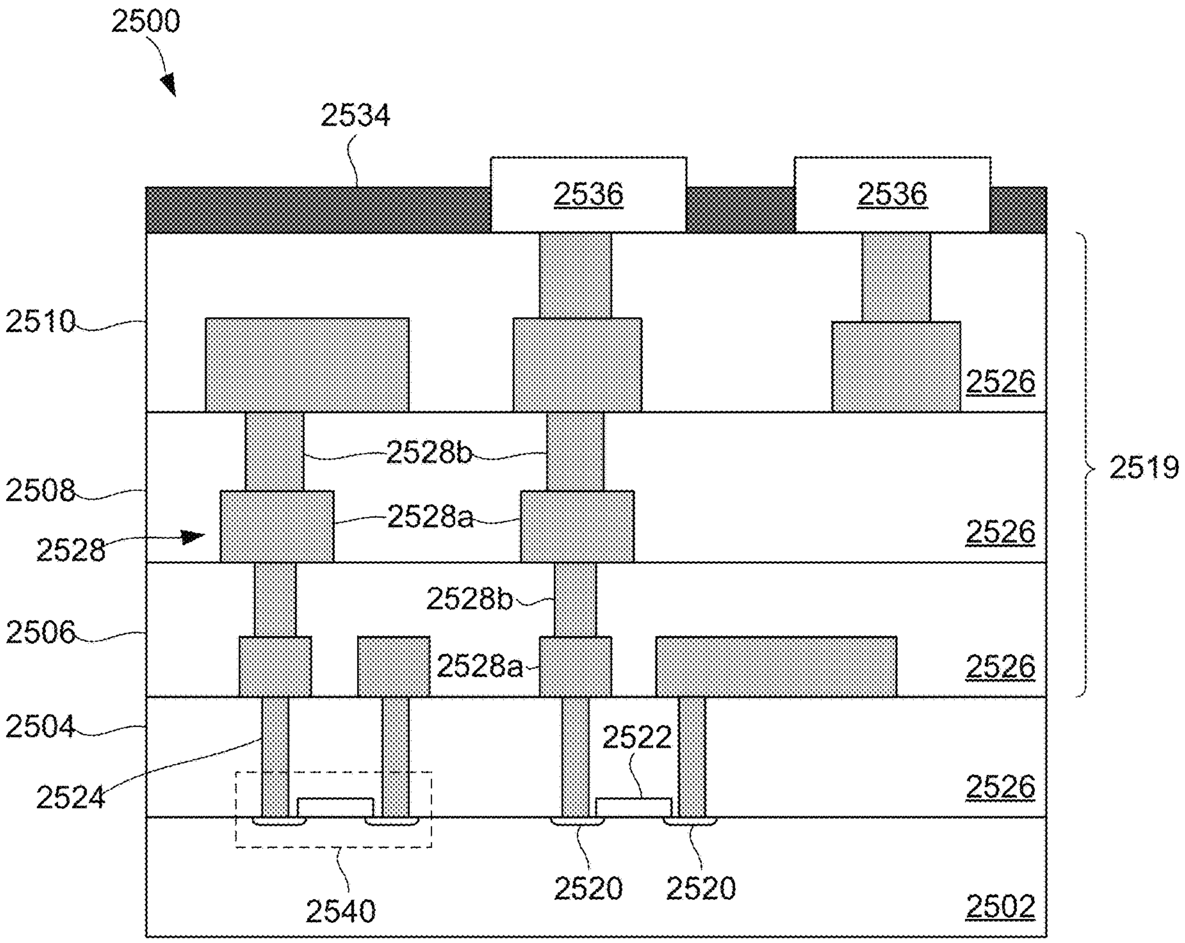
FIG. 25 is a cross-sectional side view of an integrated circuit device that may be included in a microelectronic assembly, in accordance with any of the embodiments disclosed herein.

FIG. 25 is a cross-sectional side view of an integrated circuit device 2500 that may be included in any of the systems 100 disclosed herein (e.g., in any of the substrates 106). One or more of the integrated circuit devices 2500 may be included in one or more dies 2402 (FIG. 24). The integrated circuit device 2500 may be formed on a die substrate 2502 (e.g., the wafer 2400 of FIG. 24) and may be included in a die (e.g., the die 2402 of FIG. 24). The die substrate 2502 may be a semiconductor substrate composed of semiconductor material systems including, for example, n-type or p-type materials systems (or a combination of both). The die substrate 2502 may include, for example, a crystalline substrate formed using a bulk silicon or a silicon-on-insulator (SOI) substructure. In some embodiments, the die substrate 2502 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 2502. Although a few examples of materials from which the die substrate 2502 may be formed are described here, any material that may serve as a foundation for an integrated circuit device 2500 may be used. The die substrate 2502 may be part of a singulated die (e.g., the dies 2402 of FIG. 24) or a wafer (e.g., the wafer 2400 of FIG. 24).

The integrated circuit device 2500 may include one or more device layers 2504 disposed on the die substrate 2502. The device layer 2504 may include features of one or more transistors 2540 (e.g., metal oxide semiconductor field-effect transistors (MOSFETs)) formed on the die substrate 2502. The transistors 2540 may include, for example, one or more source and/or drain (S/D) regions 2520, a gate 2522 to control current flow between the S/D regions 2520, and one or more S/D contacts 2524 to route electrical signals to/from the S/D regions 2520. The transistors 2540 may include additional features not depicted for the sake of clarity, such as device isolation regions, gate contacts, and the like. The transistors 2540 are not limited to the type and configuration depicted in FIG. 25 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 2540 may include a gate 2522 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2540 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2540 along the source-channel-drain direction, the gate electrode may consist of a U-shaped structure that includes a bottom portion substantially parallel to the surface of the die substrate 2502 and two sidewall portions that are substantially perpendicular to the top surface of the die substrate 2502. In other embodiments, at least one of the metal layers that form the gate electrode may simply be a planar layer that is substantially parallel to the top surface of the die substrate 2502 and does not include sidewall portions substantially perpendicular to the top surface of the die substrate 2502. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2520 may be formed within the die substrate 2502 adjacent to the gate 2522 of individual transistors 2540. The S/D regions 2520 may be formed using an implantation/diffusion process or an etching/deposition process, for example. In the former process, dopants such as boron, aluminum, antimony, phosphorous, or arsenic may be ion-implanted into the die substrate 2502 to form the S/D regions 2520. An annealing process that activates the dopants and causes them to diffuse farther into the die substrate 2502 may follow the ion-implantation process. In the latter process, the die substrate 2502 may first be etched to form recesses at the locations of the S/D regions 2520. An epitaxial deposition process may then be carried out to fill the recesses with material that is used to fabricate the S/D regions 2520. In some implementations, the S/D regions 2520 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2520 may be formed using one or more alternate semiconductor materials such as germanium or a group III-V material or alloy. In further embodiments, one or more layers of metal and/or metal alloys may be used to form the S/D regions 2520.

Electrical signals, such as power and/or input/output (I/O) signals, may be routed to and/or from the devices (e.g., transistors 2540) of the device layer 2504 through one or more interconnect layers disposed on the device layer 2504 (illustrated in FIG. 25 as interconnect layers 2506-2510). For example, electrically conductive features of the device layer 2504 (e.g., the gate 2522 and the S/D contacts 2524) may be electrically coupled with the interconnect structures 2528 of the interconnect layers 2506-2510. The one or more interconnect layers 2506-2510 may form a metallization stack (also referred to as an "ILD stack") 2519 of the integrated circuit device 2500.

The interconnect structures 2528 may be arranged within the interconnect layers 2506-2510 to route electrical signals according to a wide variety of designs; in particular, the arrangement is not limited to the particular configuration of interconnect structures 2528 depicted in FIG. 25. Although a particular number of interconnect layers 2506-2510 is depicted in FIG. 25, embodiments of the present disclosure include integrated circuit devices having more or fewer interconnect layers than depicted.

In some embodiments, the interconnect structures 2528 may include lines **2528*a* and/or vias 2528*b* filled with an electrically conductive material such as a metal. The lines 2528*a* may be arranged to route electrical signals in a direction of a plane that is substantially parallel with a surface of the die substrate 2502 upon which the device layer 2504 is formed. For example, the lines 2528*a* may route electrical signals in a direction in and out of the page and/or in a direction across the page from the perspective of FIG. 25. The vias 2528*b* may be arranged to route electrical signals in a direction of a plane that is substantially perpendicular to the surface of the die substrate 2502 upon which the device layer 2504 is formed. In some embodiments, the vias 2528*b* may electrically couple lines 2528*a* of different interconnect layers 2506-2510** together.

The interconnect layers 2506-2510 may include a dielectric material 2526 disposed between the interconnect structures 2528, as shown in FIG. 25. In some embodiments, dielectric material 2526 disposed between the interconnect structures 2528 in different ones of the interconnect layers 2506-2510 may have different compositions; in other embodiments, the composition of the dielectric material 2526 between different interconnect layers 2506-2510 may be the same. The device layer 2504 may include a dielectric material 2526 disposed between the transistors 2540 and a bottom layer of the metallization stack as well. The dielectric material 2526 included in the device layer 2504 may have a different composition than the dielectric material 2526 included in the interconnect layers 2506-2510; in other embodiments, the composition of the dielectric material 2526 in the device layer 2504 may be the same as a dielectric material 2526 included in any one of the interconnect layers 2506-2510.

A first interconnect layer 2506 (referred to as Metal 1 or "M1") may be formed directly on the device layer 2504. In some embodiments, the first interconnect layer 2506 may include lines 2528*a* and/or vias 2528*b*, as shown. The lines 2528*a* of the first interconnect layer 2506 may be coupled with contacts (e.g., the S/D contacts 2524) of the device layer 2504. The vias 2528*b* of the first interconnect layer 2506 may be coupled with the lines 2528*a* of a second interconnect layer 2508.

The second interconnect layer 2508 (referred to as Metal 2 or "M2") may be formed directly on the first interconnect layer 2506. In some embodiments, the second interconnect layer 2508 may include via 2528*b* to couple the lines 2528 of the second interconnect layer 2508 with the lines 2528*a* of a third interconnect layer 2510. Although the lines 2528*a* and the vias 2528*b* are structurally delineated with a line within individual interconnect layers for the sake of clarity, the lines 2528*a* and the vias 2528*b* may be structurally and/or materially contiguous (e.g., simultaneously filled during a dual-damascene process) in some embodiments.

The third interconnect layer 2510 (referred to as Metal 3 or "M3") (and additional interconnect layers, as desired) may be formed in succession on the second interconnect layer 2508 according to similar techniques and configurations described in connection with the second interconnect layer 2508 or the first interconnect layer 2506. In some embodiments, the interconnect layers that are "higher up" in the metallization stack 2519 in the integrated circuit device 2500 (i.e., farther away from the device layer 2504) may be thicker that the interconnect layers that are lower in the metallization stack 2519, with lines 2528*a* and vias 2528*b* in the higher interconnect layers being thicker than those in the lower interconnect layers.

The integrated circuit device 2500 may include a solder resist material 2534 (e.g., polyimide or similar material) and one or more conductive contacts 2536 formed on the interconnect layers 2506-2510. In FIG. 25, the conductive contacts 2536 are illustrated as taking the form of bond pads. The conductive contacts 2536 may be electrically coupled with the interconnect structures 2528 and configured to route the electrical signals of the transistor(s) 2540 to external devices. For example, solder bonds may be formed on the one or more conductive contacts 2536 to mechanically and/or electrically couple an integrated circuit die including the integrated circuit device 2500 with another component (e.g., a printed circuit board). The integrated circuit device 2500 may include additional or alternate structures to route the electrical signals from the interconnect layers 2506-2510; for example, the conductive contacts 2536 may include other analogous features (e.g., posts) that route the electrical signals to external components. The conductive contacts 2536 may serve as or be coupled to the conductive traces 102 or vias 103, 104, as appropriate.

In some embodiments in which the integrated circuit device 2500 is a double-sided die, the integrated circuit device 2500 may include another metallization stack (not shown) on the opposite side of the device layer(s) 2504. This metallization stack may include multiple interconnect layers as discussed above with reference to the interconnect layers 2506-2510, to provide conductive pathways (e.g., including conductive lines and vias) between the device layer(s) 2504 and additional conductive contacts (not shown) on the opposite side of the integrated circuit device 2500 from the conductive contacts 2536. These additional conductive contacts may serve as or be coupled to the conductive traces 102 or vias 103, 104, as appropriate.

In other embodiments in which the integrated circuit device 2500 is a double-sided die, the integrated circuit device 2500 may include one or more through silicon vias (TSVs) through the die substrate 2502; these TSVs may make contact with the device layer(s) 2504, and may provide conductive pathways between the device layer(s) 2504 and additional conductive contacts (not shown) on the opposite side of the integrated circuit device 2500 from the conductive contacts 2536. These additional conductive contacts may serve or be coupled to the conductive traces 102 or vias 103, 104, as appropriate. Multiple integrated circuit devices 2500 may be stacked with one or more TSVs in the individual stacked devices provide connection between from one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 26:
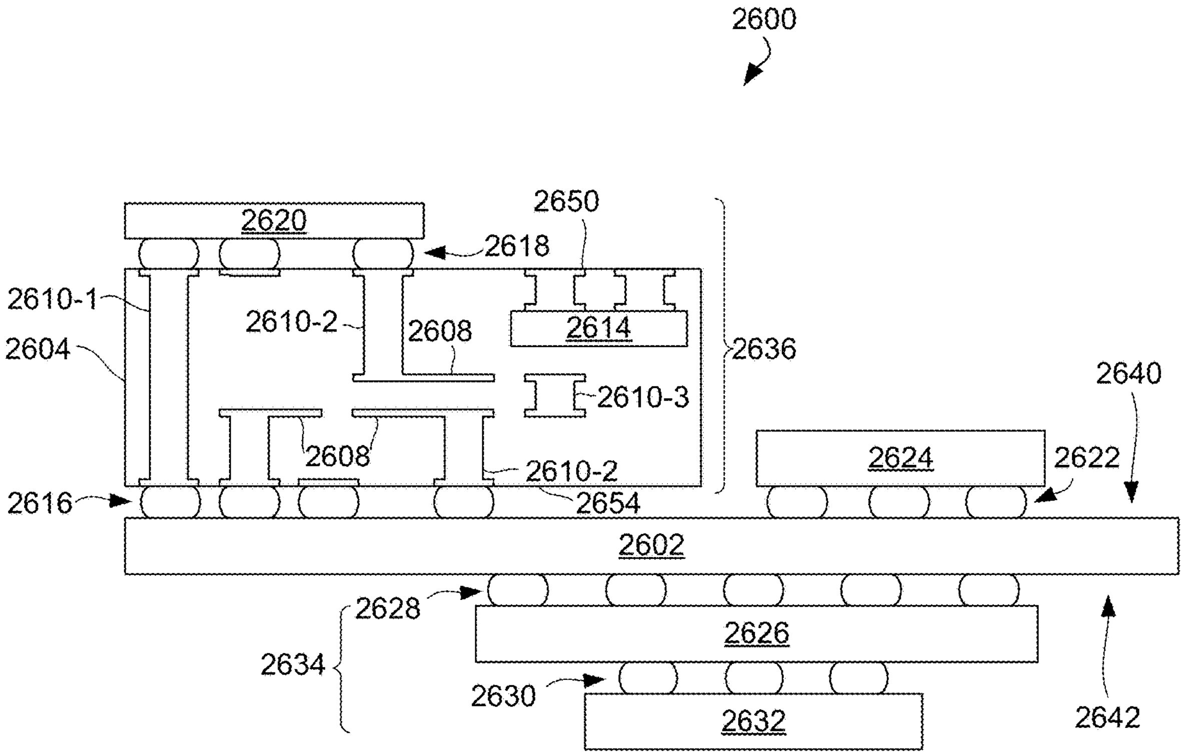
FIG. 26 is a cross-sectional side view of an integrated circuit device assembly that may include a microelectronic assembly, in accordance with any of the embodiments disclosed herein.

FIG. 26 is a cross-sectional side view of an integrated circuit device assembly 2600 that may include any of the systems 100 disclosed herein. In some embodiments, the integrated circuit device assembly 2600 may be part of or include the system 100. The integrated circuit device assembly 2600 includes a number of components disposed on a circuit board 2602 (which may be a motherboard, system board, mainboard, etc.). The integrated circuit device assembly 2600 includes components disposed on a first face 2640 of the circuit board 2602 and an opposing second face 2642 of the circuit board 2602; generally, components may be disposed on one or both faces 2640 and 2642. Any of the integrated circuit components discussed below with reference to the integrated circuit device assembly 2600 may take the form of any suitable ones of the embodiments of the system 100 disclosed herein.

In some embodiments, the circuit board 2602 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 2602. In other embodiments, the circuit board 2602 may be a non-PCB substrate. In some embodiments the circuit board 2602 may be, for example, the substrate 106. The integrated circuit device assembly 2600 illustrated in FIG. 26 includes a package-on-interposer structure 2636 coupled to the first face 2640 of the circuit board 2602 by coupling components 2616. The coupling components 2616 may electrically and mechanically couple the package-on-interposer structure 2636 to the circuit board 2602, and may include solder balls (as shown in FIG. 26), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 2616 may serve as the coupling components illustrated or described for any of the substrate assembly or substrate assembly components described herein, as appropriate.

The package-on-interposer structure 2636 may include an integrated circuit component 2620 coupled to an interposer 2604 by coupling components 2618. The coupling components 2618 may take any suitable form for the application, such as the forms discussed above with reference to the coupling components 2616. Although a single integrated circuit component 2620 is shown in FIG. 26, multiple integrated circuit components may be coupled to the interposer 2604; indeed, additional interposers may be coupled to the interposer 2604. The interposer 2604 may provide an intervening substrate used to bridge the circuit board 2602 and the integrated circuit component 2620.

The integrated circuit component 2620 may be a packaged or unpacked integrated circuit product that includes one or more integrated circuit dies (e.g., the die 2402 of FIG. 24, the integrated circuit device 2500 of FIG. 25) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 2620, a single monolithic integrated circuit die comprises solder bumps attached to contacts on the die. The solder bumps allow the die to be directly attached to the interposer 2604. The integrated circuit component 2620 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 2620 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 2620 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 2620 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 2604 may spread connections to a wider pitch or reroute a connection to a different connection. For example, the interposer 2604 may couple the integrated circuit component 2620 to a set of ball grid array (BGA) conductive contacts of the coupling components 2616 for coupling to the circuit board 2602. In the embodiment illustrated in FIG. 26, the integrated circuit component 2620 and the circuit board 2602 are attached to opposing sides of the interposer 2604; in other embodiments, the integrated circuit component 2620 and the circuit board 2602 may be attached to a same side of the interposer 2604. In some embodiments, three or more components may be interconnected by way of the interposer 2604.

In some embodiments, the interposer 2604 may be formed as a PCB, including multiple metal layers separated from one another by layers of dielectric material and interconnected by electrically conductive vias. In some embodiments, the interposer 2604 may be formed of an epoxy resin, a fiberglass-reinforced epoxy resin, an epoxy resin with inorganic fillers, a ceramic material, or a polymer material such as polyimide. In some embodiments, the interposer 2604 may be formed of alternate rigid or flexible materials that may include the same materials described above for use in a semiconductor substrate, such as silicon, germanium, and other group III-V and group IV materials. The interposer 2604 may include metal interconnects 2608 and vias 2610, including but not limited to through hole vias 2610-1 (that extend from a first face 2650 of the interposer 2604 to a second face 2654 of the interposer 2604), blind vias 2610-2 (that extend from the first or second faces 2650 or 2654 of the interposer 2604 to an internal metal layer), and buried vias 2610-3 (that connect internal metal layers).

In some embodiments, the interposer 2604 can comprise a silicon interposer. Through silicon vias (TSV) extending through the silicon interposer can connect connections on a first face of a silicon interposer to an opposing second face of the silicon interposer. In some embodiments, an interposer 2604 comprising a silicon interposer can further comprise one or more routing layers to route connections on a first face of the interposer 2604 to an opposing second face of the interposer 2604.

The interposer 2604 may further include embedded devices 2614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2604. The package-on-interposer structure 2636 may take the form of any of the package-on-interposer structures known in the art. In embodiments where the interposer is a non-printed circuit board The integrated circuit device assembly 2600 may include an integrated circuit component 2624 coupled to the first face 2640 of the circuit board 2602 by coupling components 2622. The coupling components 2622 may take the form of any of the embodiments discussed above with reference to the coupling components 2616, and the integrated circuit component 2624 may take the form of any of the embodiments discussed above with reference to the integrated circuit component 2620.

The integrated circuit device assembly 2600 illustrated in FIG. 26 includes a package-on-package structure 2634 coupled to the second face 2642 of the circuit board 2602 by coupling components 2628. The package-on-package structure 2634 may include an integrated circuit component 2626 and an integrated circuit component 2632 coupled together by coupling components 2630 such that the integrated circuit component 2626 is disposed between the circuit board 2602 and the integrated circuit component 2632. The coupling components 2628 and 2630 may take the form of any of the embodiments of the coupling components 2616 discussed above, and the integrated circuit components 2626 and 2632 may take the form of any of the embodiments of the integrated circuit component 2620 discussed above. The package-on-package structure 2634 may be configured in accordance with any of the package-on-package structures known in the art.

Figure 27:
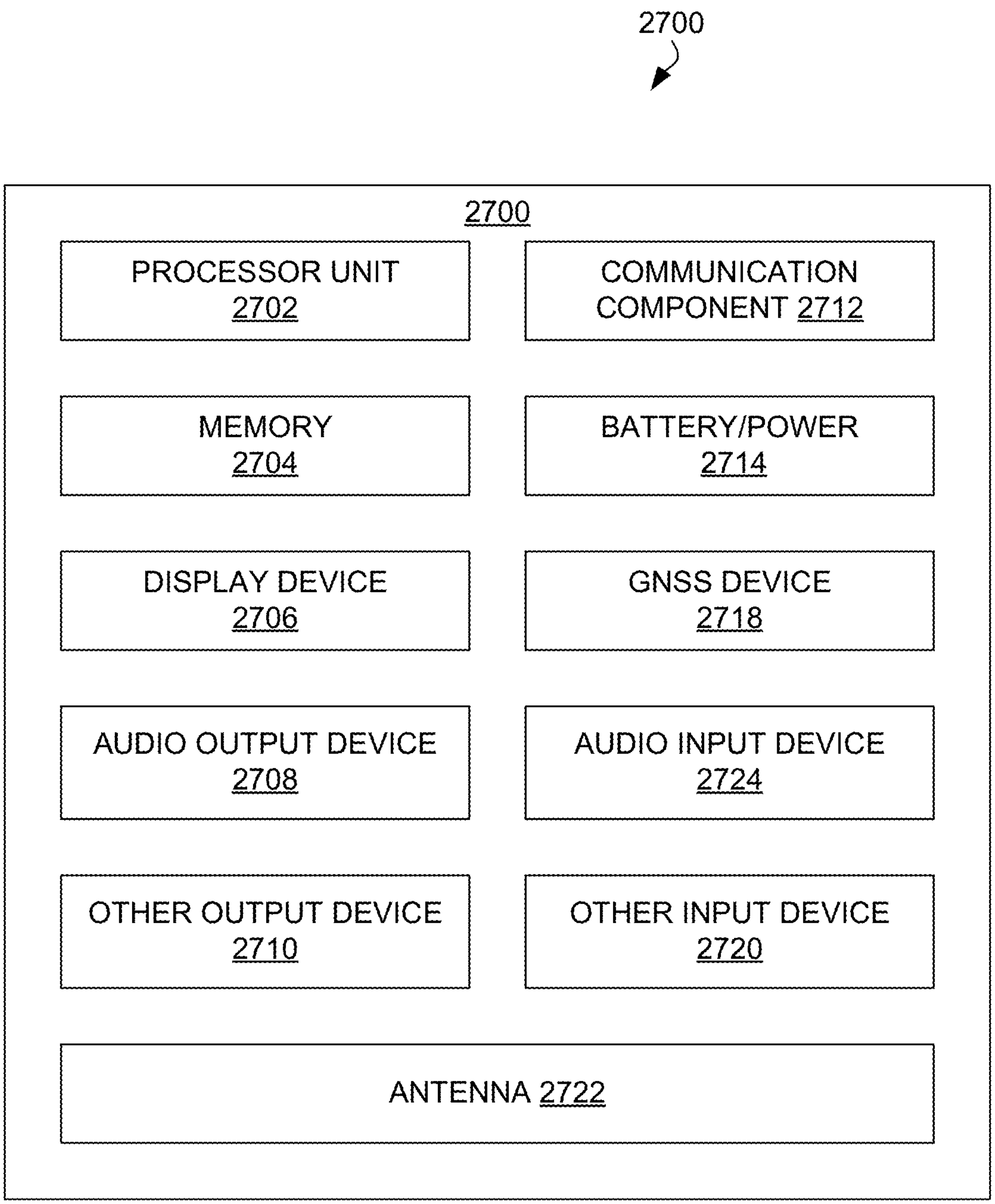
FIG. 27 is a block diagram of an example electrical device that may include a microelectronic assembly, in accordance with any of the embodiments disclosed herein.

FIG. 27 is a block diagram of an example electrical device 2700 that may include one or more of the system 100 disclosed herein. For example, any suitable ones of the components of the electrical device 2700 may include one or more of the integrated circuit device assemblies 2600, integrated circuit components 2620, integrated circuit devices 2500, or integrated circuit dies 2402 disclosed herein, and may be arranged in any of the systems 100 disclosed herein. A number of components are illustrated in FIG. 27 as included in the electrical device 2700, but any one or more of these components may be omitted or duplicated, as suitable for the application. In some embodiments, some or all of the components included in the electrical device 2700 may be attached to one or more motherboards mainboards, or system boards. In some embodiments, one or more of these components are fabricated onto a single system-on-a-chip (SoC) die.

Additionally, in various embodiments, the electrical device 2700 may not include one or more of the components illustrated in FIG. 27, but the electrical device 2700 may include interface circuitry for coupling to the one or more components. For example, the electrical device 2700 may not include a display device 2706, but may include display device interface circuitry (e.g., a connector and driver circuitry) to which a display device 2706 may be coupled. In another set of examples, the electrical device 2700 may not include an audio input device 2724 or an audio output device 2708, but may include audio input or output device interface circuitry (e.g., connectors and supporting circuitry) to which an audio input device 2724 or audio output device 2708 may be coupled.

The electrical device 2700 may include one or more processor units 2702 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 2702 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as a XPU (or xPU).

The electrical device 2700 may include a memory 2704, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 2704 may include memory that is located on the same integrated circuit die as the processor unit 2702. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 2700 can comprise one or more processor units 2702 that are heterogeneous or asymmetric to another processor unit 2702 in the electrical device 2700. There can be a variety of differences between the processing units 2702 in a system in terms of a spectrum of metrics of merit including architectural, microarchitectural, thermal, power consumption characteristics, and the like. These differences can effectively manifest themselves as asymmetry and heterogeneity among the processor units 2702 in the electrical device 2700.

In some embodiments, the electrical device 2700 may include a communication component 2712 (e.g., one or more communication components). For example, the communication component 2712 can manage wireless communications for the transfer of data to and from the electrical device 2700. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 2712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 2712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 2712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 2712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 2712 may operate in accordance with other wireless protocols in other embodiments. The electrical device 2700 may include an antenna 2722 to facilitate wireless communications and/or to receive other wireless communications (such as AM or FM radio transmissions).

In some embodiments, the communication component 2712 may manage wired communications, such as electrical, optical, or any other suitable communication protocols (e.g., IEEE 802.3 Ethernet standards). As noted above, the communication component 2712 may include multiple communication components. For instance, a first communication component 2712 may be dedicated to shorter-range wireless communications such as Wi-Fi or Bluetooth, and a second communication component 2712 may be dedicated to longer-range wireless communications such as global positioning system (GPS), EDGE, GPRS, CDMA, WiMAX, LTE, EV-DO, or others. In some embodiments, a first communication component 2712 may be dedicated to wireless communications, and a second communication component 2712 may be dedicated to wired communications.

The electrical device 2700 may include battery/power circuitry 2714. The battery/power circuitry 2714 may include one or more energy storage devices (e.g., batteries or capacitors) and/or circuitry for coupling components of the electrical device 2700 to an energy source separate from the electrical device 2700 (e.g., AC line power).

The electrical device 2700 may include a display device 2706 (or corresponding interface circuitry, as discussed above). The display device 2706 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 2700 may include an audio output device 2708 (or corresponding interface circuitry, as discussed above). The audio output device 2708 may include any embedded or wired or wirelessly connected external device that generates an audible indicator, such speakers, headsets, or earbuds.

The electrical device 2700 may include an audio input device 2724 (or corresponding interface circuitry, as discussed above). The audio input device 2724 may include any embedded or wired or wirelessly connected device that generates a signal representative of a sound, such as microphones, microphone arrays, or digital instruments (e.g., instruments having a musical instrument digital interface (MIDI) output). The electrical device 2700 may include a Global Navigation Satellite System (GNSS) device 2718 (or corresponding interface circuitry, as discussed above), such as a Global Positioning System (GPS) device. The GNSS device 2718 may be in communication with a satellite-based system and may determine a geolocation of the electrical device 2700 based on information received from one or more GNSS satellites, as known in the art.

The electrical device 2700 may include an other output device 2710 (or corresponding interface circuitry, as discussed above). Examples of the other output device 2710 may include an audio codec, a video codec, a printer, a wired or wireless transmitter for providing information to other devices, or an additional storage device.

The electrical device 2700 may include an other input device 2720 (or corresponding interface circuitry, as discussed above). Examples of the other input device 2720 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 2700 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 2700 may be any other electronic device that processes data. In some embodiments, the electrical device 2700 may comprise multiple discrete physical components. Given the range of devices that the electrical device 2700 can be manifested as in various embodiments, in some embodiments, the electrical device 2700 can be referred to as a computing device or a computing system.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry. A computing system referred to as being programmed to perform a method can be programmed to perform the method via software, hardware, firmware or combinations thereof.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid-state drives, chalcogenide-based phase-change nonvolatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes a method comprising applying a first layer to a substrate, wherein the first layer comprises a photoimageable dielectric (PID) material; applying a second layer to the first layer, wherein the second layer comprises a PID material or a photoresist material; applying a third layer to the second layer, wherein the third layer comprises a photoresist material; exposing the first layer, the second layer, and the third layer with electromagnetic radiation with use of a multi-tone photomask, wherein the electromagnetic radiation through one or more light gray regions of the multi-tone photomask exposes two but not three of the first layer, second layer, and third layer, and wherein the electromagnetic radiation through one or more dark gray regions of the multi-tone photomask exposes only one of the first layer, second layer, and third layer; developing the first layer, the second layer, and the third layer, wherein the developed first layer defines a first mold with a first via region, wherein the developed second layer defines a second mold with a conductive trace region and a second via region, wherein the developed third layer comprises an overhang region that extends over the second via region; filling the mold defined by the first layer and the mold defined by the second layer with a conductive infill; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the second via region, wherein the etched conductive infill comprises a first via in the first via region, a conductive trace in the conductive trace region, and a second via in the second via region.

Example 2 includes the subject matter of Example 1, and wherein the electromagnetic radiation (i) exposes the first layer, the second layer, and the third layer through the one or more light regions, (ii) exposes the first layer and the third layer through the one or more light gray regions and does not expose the second layer through the one or more light gray regions, (iii) exposes the first layer through the one or more dark gray regions and does not expose the second layer or third layer through the one or more dark gray regions, and (iv) does not expose any of the first layer, the second layer, or the third layer through the one or more dark regions, wherein the one or more dark regions define the first via region, wherein the one or more dark gray regions define the conductive trace region, and wherein the one or more light gray regions define the second via region.

Example 3 includes the subject matter of any of Examples 1 and 2, and wherein the first layer comprises a PID material and the second layer comprises a photoresist material, the method further comprising removing the second layer and the third layer while keeping the first layer in place.

Example 4 includes the subject matter of any of Examples 1-3, and wherein the first layer comprises a PID material and the second layer comprises a PID material, the method further comprising removing the third layer while keeping the first layer and the second layer in place.

Example 5 includes the subject matter of any of Examples 1-4, and wherein a cross-sectional profile of the second via has a concave shape with a narrower region distal from the substrate and a broader region proximal to the substrate.

Example 6 includes the subject matter of any of Examples 1-5, and wherein the first via has a cross-sectional profile taken parallel to the conductive trace that is linearly tapered.

Example 7 includes the subject matter of any of Examples 1-6, and wherein the first layer comprises a negative PID material, wherein the second layer comprises a negative photoresist material, and wherein the third layer comprises a negative photoresist material.

Example 8 includes the subject matter of any of Examples 1-7, and wherein the first layer comprises a negative PID material, wherein the second layer comprises a negative PID material, and wherein the third layer comprises a negative photoresist material.

Example 9 includes the subject matter of any of Examples 1-8, and wherein the conductive infill comprises copper.

Example 10 includes the subject matter of any of Examples 1-9, and wherein the substrate comprises silicon.

Example 11 includes the subject matter of any of Examples 1-10, and wherein the conductive trace has a width between 0.5 and 4 micrometers and a height between 0.5 and 4 micrometers, wherein the first via has a width that is within 0.1 micrometers of the width of the conductive trace, wherein the second via has a width that is within 0.1 micrometers of the width of the conductive trace.

Example 12 includes the subject matter of any of Examples 1-11, and further including creating a redistribution layer comprising the first via, the second via, and the conductive trace; and packaging the redistribution layer with one or more integrated circuits in a package.

Example 13 includes the subject matter of any of Examples 1-12, and further including creating a capacitor comprising the conductive trace, the first via, and the second via.

Example 14 includes the subject matter of any of Examples 1-13, and further including creating an inductor comprising the conductive trace, the first via, and the second via.

Example 15 includes an apparatus comprising a plurality of conductive traces on a substrate; a first plurality of vias, wherein individual vias of the first plurality of vias connect individual conductive traces of the plurality of conductive trace to a first layer of the apparatus; and a second plurality of vias, wherein individual vias of the second plurality of vias connect individual conductive traces of the plurality of conductive trace to a second layer of the apparatus different from the first, wherein a pitch of the plurality of conductive traces is less than three times a width of individual conductive traces of the plurality of conductive traces, wherein a pitch of the first plurality of vias is less than three times the width of individual conductive traces of the plurality of conductive traces, wherein a pitch of the second plurality of vias is less than three times the width of individual conductive traces of the plurality of conductive traces.

Example 16 includes the subject matter of Example 15, and wherein individual conductive traces of the plurality of conductive traces have a width between 0.5 and 4 micrometers, wherein individual vias of the first plurality of vias have a width that is within 0.1 micrometers of a width of the connected conductive trace, wherein individual vias of the second plurality of vias have a width that is within 0.1 micrometers of the width of the connected conductive trace.

Example 17 includes the subject matter of any of Examples 15 and 16, and wherein a layer surrounding the second plurality of vias comprises a photoimageable dielectric (PID) material.

Example 18 includes the subject matter of any of Examples 15-17, and wherein a cross-section profile of the second via has a concave shape with a narrower region distal from the substrate and a broader region proximal to the substrate.

Example 19 includes the subject matter of any of Examples 15-18, and wherein the first via has a cross-section taken parallel to the conductive trace that is linearly tapered.

Example 20 includes the subject matter of any of Examples 15-19, and wherein the apparatus is a processor, the processor comprising one or more processor dies; a redistribution layer connected to the one or more processor dies, the redistribution layer comprising the plurality of conductive traces, the first plurality of vias, and the second plurality of vias.

The invention claimed is:

1. A method comprising:

applying a first layer to a substrate, wherein the first layer comprises a photoimageable dielectric (PID) material;

applying a second layer to the first layer, wherein the second layer comprises a PID material or a photoresist material;

applying a third layer to the second layer, wherein the third layer comprises a photoresist material;

exposing the first layer, the second layer, and the third layer with electromagnetic radiation with use of a multi-tone photomask, wherein the electromagnetic radiation through one or more light gray regions of the multi-tone photomask exposes two but not three of the first layer, second layer, and third layer, and wherein the electromagnetic radiation through one or more dark gray regions of the multi-tone photomask exposes only one of the first layer, second layer, and third layer;

developing the first layer, the second layer, and the third layer, wherein the developed first layer defines a first mold with a first via region, wherein the developed second layer defines a second mold with a conductive trace region and a second via region, wherein the developed third layer comprises an overhang region that extends over the second via region;

filling the mold defined by the first layer and the mold defined by the second layer with a conductive infill; and applying an etchant to the conductive infill, wherein the etchant etches the conductive infill from a top surface of the conductive infill to create a conductive trace in the conductive trace region, wherein the etchant laterally etches the conductive infill under the overhang region to create a via in the second via region, wherein the etched conductive infill comprises a first via in the first via region, a conductive trace in the conductive trace region, and a second via in the second via region.

2. The method of claim 1, wherein the electromagnetic radiation (i) exposes the first layer, the second layer, and the third layer through the one or more light regions, (ii) exposes the first layer and the third layer through the one or more light gray regions and does not expose the second layer through the one or more light gray regions, (iii) exposes the first layer through the one or more dark gray regions and does not expose the second layer or third layer through the one or more dark gray regions, and (iv) does not expose any of the first layer, the second layer, or the third layer through the one or more dark regions, wherein the one or more dark regions define the first via region, wherein the one or more dark gray regions define the conductive trace region, and wherein the one or more light gray regions define the second via region.

3. The method of claim 1, wherein the first layer comprises a PID material and the second layer comprises a photoresist material, the method further comprising:

removing the second layer and the third layer while keeping the first layer in place.

4. The method of claim 1, wherein the first layer comprises a PID material and the second layer comprises a PID material, the method further comprising:

removing the third layer while keeping the first layer and the second layer in place.

5. The method of claim 1, wherein a cross-sectional profile of the second via has a concave shape with a narrower region distal from the substrate and a broader region proximal to the substrate.

6. The method of claim 5, wherein the first via has a cross-sectional profile taken parallel to the conductive trace that is linearly tapered.

7. The method of claim 1, wherein the first layer comprises a negative PID material, wherein the second layer comprises a negative photoresist material, and wherein the third layer comprises a negative photoresist material.

8. The method of claim 1, wherein the first layer comprises a negative PID material, wherein the second layer comprises a negative PID material, and wherein the third layer comprises a negative photoresist material.

9. The method of claim 1, wherein the conductive infill comprises copper.

10. The method of claim 1, wherein the substrate comprises silicon.

11. The method of claim 1, wherein the conductive trace has a width between 0.5 and 4 micrometers and a height between 0.5 and 4 micrometers, wherein the first via has a width that is within 0.1 micrometers of the width of the conductive trace, wherein the second via has a width that is within 0.1 micrometers of the width of the conductive trace.

12. The method of claim 1, further comprising:

creating a redistribution layer comprising the first via, the second via, and the conductive trace; and packaging the redistribution layer with one or more integrated circuits in a package.

13. The method of claim 1, further comprising creating a capacitor comprising the conductive trace, the first via, and the second via.

14. A method comprising:

depositing a multi-layer stack on a substrate, wherein the multi-layer stack comprises a plurality of photo-sensitive layers;

exposing the multi-layer stack with electromagnetic radiation with use of a multi-tone photomask, wherein the electromagnetic radiation through one or more light gray regions of the multi-tone photomask exposes at least two layers of the multi-layer stack and does not expose at least one layer of the multi-layer stack, and wherein the electromagnetic radiation through one or more dark gray regions of the multi-tone photomask exposes at least one layer of the multi-layer stack and does not expose at least two layers of the multi-layer stack; and developing the multi-layer stack, wherein a first developed layer defines a first mold with a first via, wherein a second developed layer defines a second mold with a conductive trace and a second via, wherein a third developed layer comprises an overhang region that extends over the second via.

15. The method of claim 14, wherein the multi-layer stack comprises a photoimageable dielectric (PID) material.

16. The method of claim 14, wherein a cross-sectional profile of the second via has a concave shape with a narrower region distal from the substrate and a broader region proximal to the substrate.

17. The method of claim 16, wherein the first via has a cross-sectional profile taken parallel to the conductive trace that is linearly tapered.

18. The method of claim 14, wherein the conductive trace has a width between 0.5 and 4 micrometers and a height between 0.5 and 4 micrometers, wherein the first via has a width that is within 0.1 micrometers of the width of the conductive trace, wherein the second via has a width that is within 0.1 micrometers of the width of the conductive trace.

19. A method comprising:

creating, in one iteration of a photolithography process, a first via, a trace aligned on the first via, and a second via aligned on the trace, wherein the second via is above the trace, wherein the trace is above the first via, wherein the one iteration of the photolithography process comprises:

depositing a multi-layer stack on a substrate, wherein the multi-layer stack comprises a plurality of photo-sensitive layers;

exposing the multi-layer stack with electromagnetic radiation with use of a multi-tone photomask; and developing the multi-layer stack to simultaneously create (i) a first mold for the first via in a first layer of the multi-layer stack, (ii) a second mold for the trace and the second via in a second layer of the multi-layer stack, and (iii) an overhang region that extends over the second via in a third layer of the multi-layer stack.

20. The method of claim 19, further comprising:

filling the first mold and the second mold with a conductive material;

etching part of the conductive material in the second mold under the overhang region to form the second via.

* * * * *